(12) United States Patent
Chang et al.

(10) Patent No.: US 9,892,302 B2
(45) Date of Patent: Feb. 13, 2018

(54) FINGERPRINT SENSING DEVICE AND METHOD FOR PRODUCING THE SAME

(71) Applicant: TONG HSING ELECTRONIC INDUSTRIES, LTD., Taipei (TW)

(72) Inventors: Chia-Shuai Chang, Taipei (TW); Zzu-Chi Chiu, Taipei (TW); Chien-Cheng Wei, Taipei (TW)

(73) Assignee: Tong Hsing Electronic Industries, Ltd., Taipei (TW)

( * ) Notice: Subject to any disclaimer, the term of this patent is extended or adjusted under 35 U.S.C. 154(b) by 19 days.

(21) Appl. No.: 15/255,395

(22) Filed: Sep. 2, 2016

(65) Prior Publication Data

US 2017/0083740 A1 Mar. 23, 2017

(30) Foreign Application Priority Data

Sep. 18, 2015 (TW) .............................. 104130966 A

(51) Int. Cl.
*G06K 9/00* (2006.01)
*H01L 31/14* (2006.01)
(Continued)

(52) U.S. Cl.
CPC ........ *G06K 9/00013* (2013.01); *H01L 25/165* (2013.01); *H01L 25/50* (2013.01);
(Continued)

(58) Field of Classification Search
CPC ........... G06K 9/00013; G06K 9/00019; G06K 9/00026; G06K 9/00084; G06K 9/00065;
(Continued)

(56) References Cited

U.S. PATENT DOCUMENTS 5,088,817 A * 2/1992 Igaki .................. G06K 9/00046
250/556
5,210,588 A * 5/1993 Lee ....................... A61B 5/1172
356/71
(Continued)

FOREIGN PATENT DOCUMENTS

CN 102844769 A 12/2012
TW 481930 A 4/2002
(Continued)

OTHER PUBLICATIONS

Search Report for Taiwan Patent Application No. 104130966, 2 pgs, dated Apr. 27, 2016.

*Primary Examiner* — Amir Alavi
(74) *Attorney, Agent, or Firm* — McNees Wallace & Nurick LLC

(57) ABSTRACT

A fingerprint sensing device includes an insulating package, an image-sensing die, a light-emitting element, and a conductive component. The insulating package has a bottom surface and a top surface formed with first and second recesses. The image-sensing die is disposed in the first recess and has an outer surface exposed therefrom. The light-emitting element is disposed in the second recess and has an outer surface exposed from the second recess, and an electrode unit. The conductive component is formed in the insulating package, has top and bottom ends exposed from the top and bottom surfaces of the insulating package, and is electrically coupled to the image-sensing die and the electrode unit.

36 Claims, 23 Drawing Sheets

(51) Int. Cl.
  *H01L 25/00* (2006.01)
  *H01L 25/16* (2006.01)
  *H01L 27/146* (2006.01)
  *H01L 33/48* (2010.01)

(52) U.S. Cl.
  CPC .......... *H01L 31/143* (2013.01); *H01L 25/167* (2013.01); *H01L 27/14678* (2013.01); *H01L 33/48* (2013.01); *H01L 2224/48091* (2013.01)

(58) Field of Classification Search
  CPC ... H01L 32/143; H01L 25/167; H01L 25/165; H01L 25/50
  See application file for complete search history.

(56) References Cited

U.S. PATENT DOCUMENTS

| | | | |
|---|---|---|---|
| 5,942,761 A * | 8/1999 | Tuli | G06K 7/10722 250/556 |
| 6,628,810 B1 * | 9/2003 | Harkin | A61B 5/1171 382/116 |
| 6,829,375 B1 * | 12/2004 | Higuchi | G06K 9/0004 382/124 |
| 8,569,875 B2 | 10/2013 | Bond et al. | |
| 9,622,556 B2 * | 4/2017 | Fathollahi | A45C 11/00 |
| 2004/0070076 A1 | 4/2004 | Hayashimoto et al. | |
| 2004/0252867 A1 * | 12/2004 | Lan | G06K 9/0004 382/124 |
| 2010/0208953 A1 * | 8/2010 | Gardner | G06K 9/00006 382/124 |
| 2011/0079903 A1 | 4/2011 | Liu | |
| 2013/0043570 A1 | 2/2013 | Lin et al. | |
| 2013/0120242 A1 | 5/2013 | Takakura | |
| 2014/0213009 A1 | 7/2014 | Wada | |
| 2015/0138331 A1 | 5/2015 | Huang | |
| 2017/0076134 A1 * | 3/2017 | Lin | G06K 9/00053 |
| 2017/0083740 A1 * | 3/2017 | Chang | G06K 9/00013 |

FOREIGN PATENT DOCUMENTS

| | | |
|---|---|---|
| TW | 200406048 A | 4/2004 |
| TW | 201113992 A | 4/2011 |
| TW | 201128755 A1 | 8/2011 |
| TW | 201330237 A1 | 7/2013 |
| TW | 201441940 A | 11/2014 |
| TW | 201520903 A | 6/2015 |
| WO | 01/15237 A1 | 3/2001 |
| WO | 2011109694 A1 | 9/2011 |

* cited by examiner

FINGERPRINT SENSING DEVICE AND METHOD FOR PRODUCING THE SAME

CROSS-REFERENCE TO RELATED APPLICATION

This application claims priority of Taiwanese Patent Application No. 104130966, filed on Sep. 18, 2015.

FIELD

The disclosure relates to a fingerprint sensing device, more particularly to a capacitive fingerprint sensing device.

BACKGROUND

Conventional fingerprint sensing devices may be classified into two major types, including optical fingerprint sensing devices and capacitive fingerprint sensing devices. The optical sensing devices may include a light source, a prism and an image-sensing element (e.g., a camera). When a user's fingertip is placed on the prism, the image-sensing element is able to capture the fingerprint image by taking into account the varying luminous intensity of light reflected from the ridges and valleys of the fingertip. However, inclusion of the prism causes conventional optical fingerprint sensing devices to be relatively bulky in size and have limited applicability in handheld electronic devices. In the case of conventional capacitive fingerprint sensing devices, generation of the user's fingerprint image usually involves the inclusion of high-density capacitive or pressure sensors that detect charge variations between ridges and valleys of the fingertip. Although the conventional capacitive fingerprint sensing devices are relatively compact in size, the production cost is relatively high and the image resolution is relatively low.

Referring to FIG. 1, U.S. Pat. No. 8,569,875 discloses a fingerprint sensing device 1, comprising a chip 11, a circuit substrate 13, and a package 14. The chip 11 is disposed on the circuit substrate 13 and has a top surface 111 including a sensing region 112, and a plurality of connecting pads 113 that are electrically coupled to the conductive pads 131 of the circuit substrate 13 via metal wires 12 for signal transmission. The package 14 partially encapsulates the chip 11 to expose the sensing region 112 for contact with a user's fingertip, as well as to protect the electrical connection between the connecting pads 113, the conductive pads 131 and the connecting wires 12. However, such configuration of the package 14 requires special molds to prevent a molding material from coming into contact with the sensing region 112 during the formation of the package 14. In addition, since the package 14 is not coplanar with the sensing region 112 of the chip 11, finger movement of the user may be limited.

SUMMARY

According to one aspect of the present disclosure, a fingerprint sensing device is provided. Such a fingerprint sensing device may include an insulating package, an image-sensing die, a light-emitting element, and a conductive component. The insulating package may have a top surface that is formed with a first recess and a second recess, and a bottom surface that is opposite to the top surface. The image-sensing die may be disposed in the first recess and have an outer surface that is exposed from the first recess and that includes a sensing region and a connecting region. The light-emitting element may be disposed in the second recess and have an outer surface that is exposed from the second recess, and an electrode unit. The conductive component may be formed in the insulating package and have opposite top and bottom ends that are respectively exposed from the top and bottom surfaces of the insulating package. The conductive component may be electrically coupled to the connecting region of the image-sensing die and the electrode unit of the light-emitting element.

According to another aspect of the present disclosure, a method for producing a fingerprint sensing device is provided. Such a method may include the steps of: providing a supporting component including a positioning member that has a positioning surface, and a lead frame that is connected to the positioning member; attaching an image-sensing die and a light-emitting element onto the positioning surface of the positioning member; forming an insulating package to encapsulate the image-sensing die, the light-emitting element and the lead frame, wherein the insulating package has a top surface that is connected to the positioning surface of the positioning member, and a bottom surface that is opposite to the top surface; removing the positioning member from the insulating package, so as to expose the lead frame, the image-sensing die, and the light-emitting element from the top surface of the insulating package; and forming a top circuit pattern layer on the top surface of the insulating package, such that the lead frame and the image-sensing die are electrically coupled to the top circuit pattern layer.

According to yet another aspect of the present disclosure, a method for producing a fingerprint sensing device is provided. Such a method may include the steps of: providing a supporting component including a positioning member that has a positioning surface, and a lead frame that is connected to the positioning surface of the positioning member; attaching an image-sensing die and a light-emitting element onto the positioning surface of the positioning member; forming an insulating package to encapsulate the image-sensing die, the light-emitting element, and the lead frame, wherein the insulating package has a top surface that is connected to the positioning surface of the positioning member, and a bottom surface; forming a hole in the insulating package so as to expose a connecting surface of the lead frame, the hole being defined by a surrounding surface; forming a conductive element on the surrounding surface which is electrically coupled to the connecting surface of the lead frame; removing the insulating package, so as to expose the lead frame, the image-sensing die, and the light-emitting element from the top surface of the insulating package; and forming a top circuit pattern layer on the top surface of the insulating package, such that the lead frame and the image-sensing die are electrically coupled to the top circuit pattern layer.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
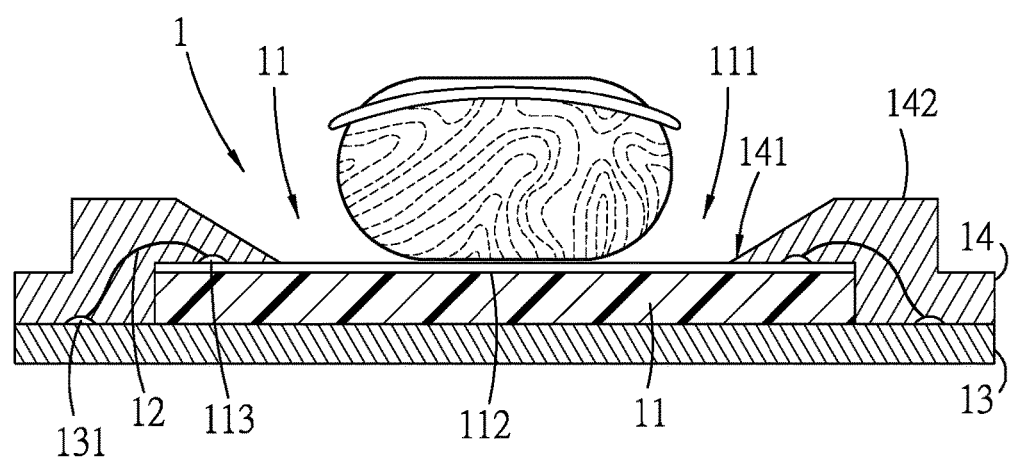
FIG. 1 is a schematic sectional view of a conventional fingerprint sensing device.

Before the disclosure is described in greater detail, it should be noted that like elements are denoted by the same reference numerals throughout the disclosure.

Figure 2:
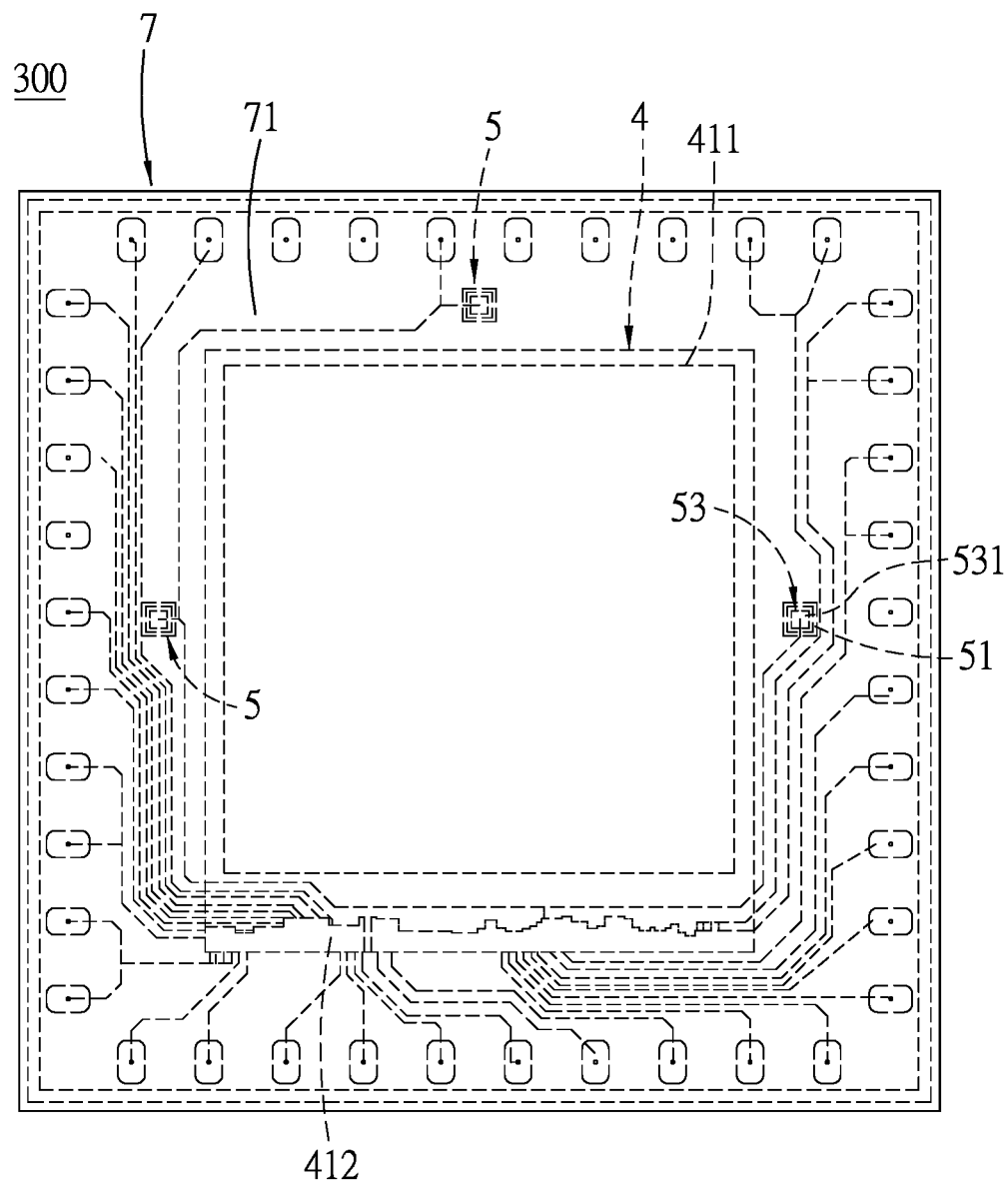
FIG. 2 is top plan view of a first exemplary embodiment of a fingerprint sensing device according to the present disclosure.
Figure 3:
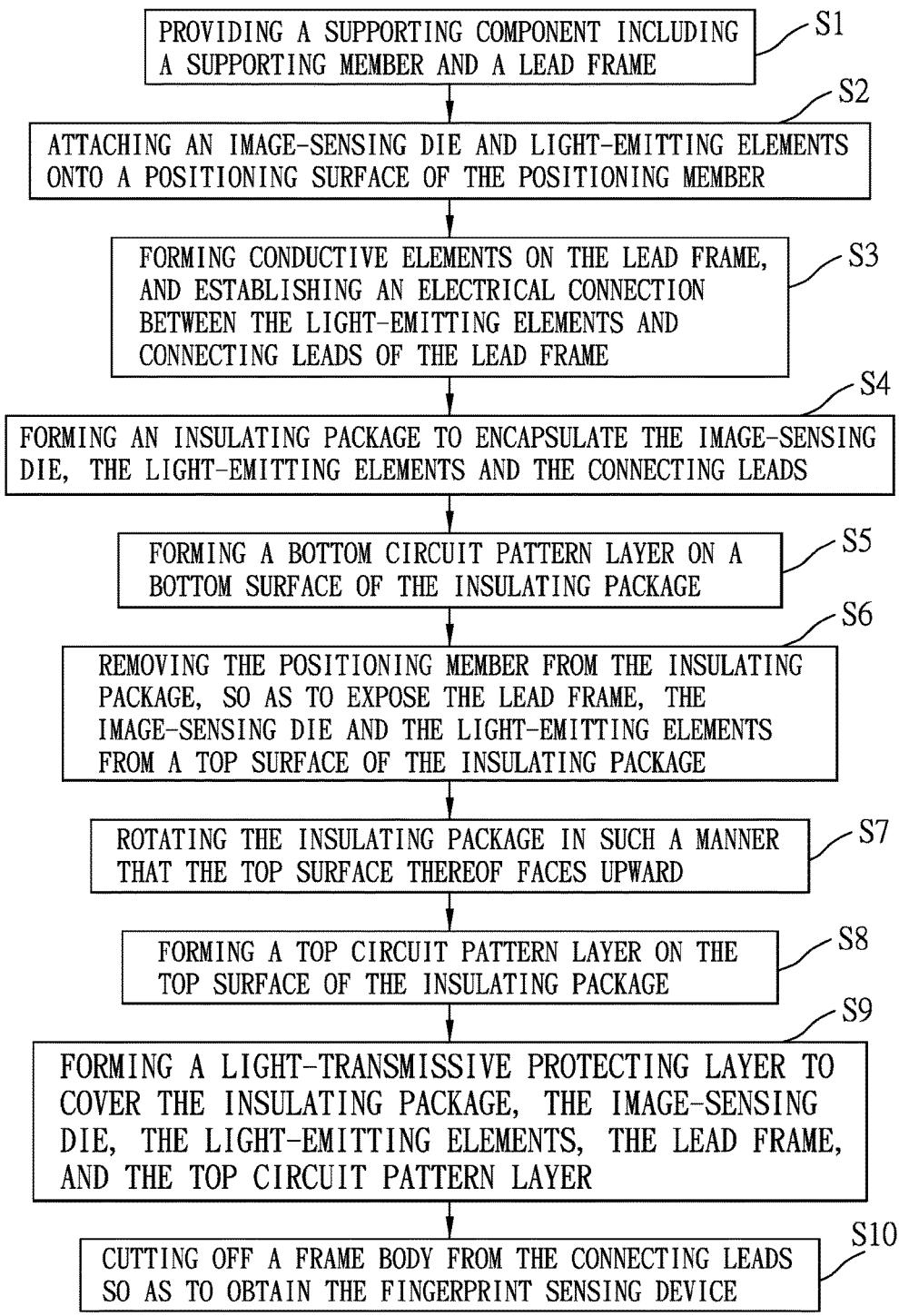
FIG. 3 is a flow chart of the first exemplary embodiment, illustrating a method for producing the fingerprint sensing device.

Referring to FIGS. 2 and 3, the first exemplary embodiment of a method for producing a fingerprint sensing device 300 as shown in FIG. 2 may include steps as illustrated in FIG. 3. The steps in FIG. 3 are described below.

Figure 4:
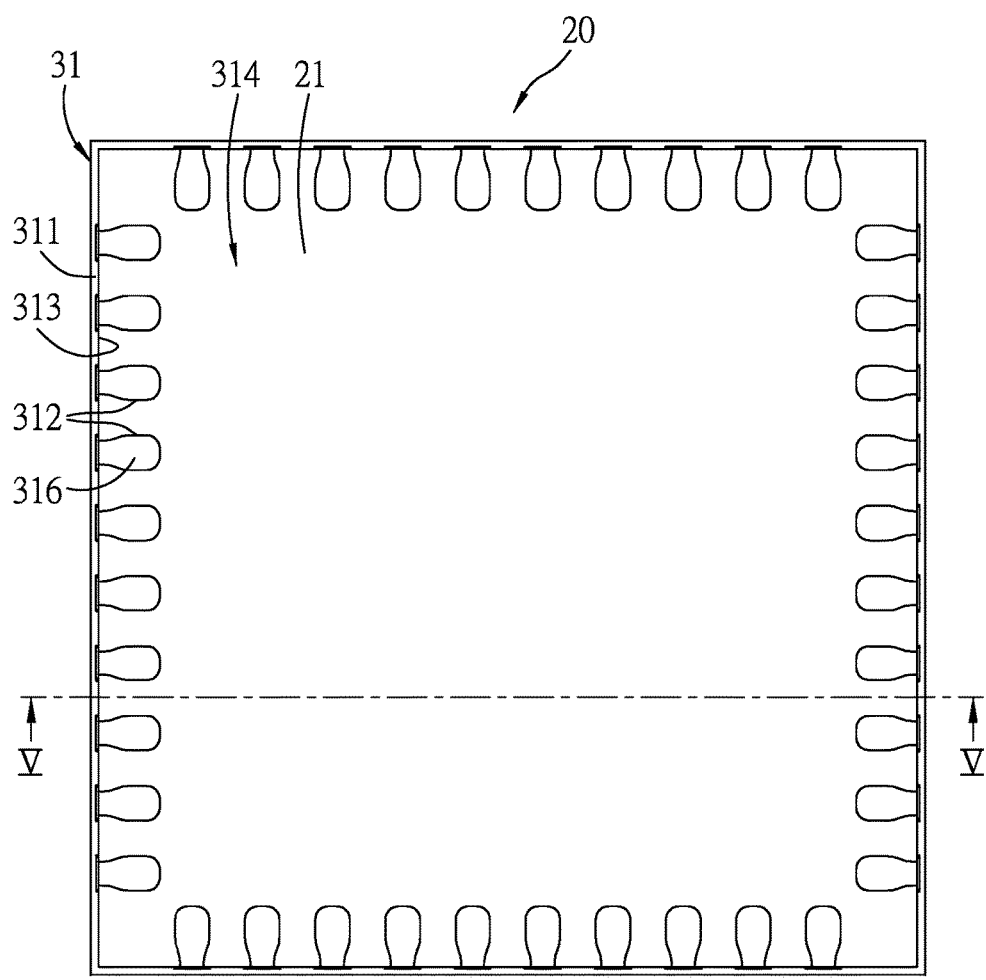
FIGS. 4 and 5 respectively are a top plan view and a sectional view of the first exemplary embodiment, illustrating a step of providing a supporting component.
Figure 5:
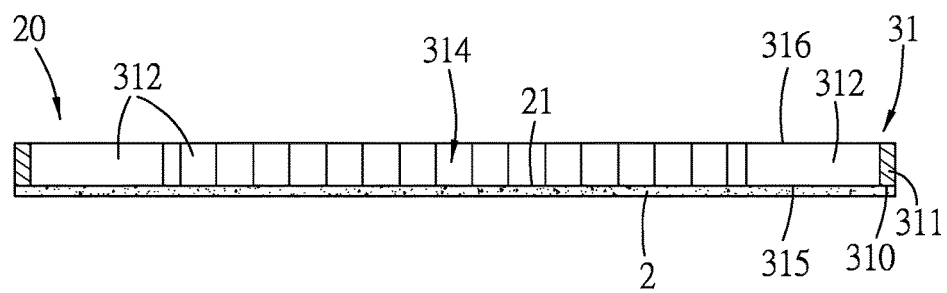

Step S1: providing a supporting component 20 as illustrated in FIGS. 4 and 5, which includes a lead frame 31 and a positioning member 2 that has a positioning surface 21. In certain embodiments, the positioning member 2 may be configured to have a quadrilateral shape as illustrated in FIG. 4. The lead frame 31 is connected to the positioning surface 21 of the positioning member 2. In certain embodiments, the lead frame 31 may include a frame body 311 having a plurality of connecting leads 312 that are mutually spaced apart and that extend inward from an inner surrounding surface 313 of the frame body 311. As illustrated in FIG. 4, the frame body 311 and the connecting leads 312 may cooperatively define an accommodating space 314 that partially exposes the positioning surface 21 of the positioning member 2. In such embodiments, each of the connecting leads 312 may have an outer end surface 315 and a connecting surface 316 that is opposite to the outer end surface 315. In certain embodiments, the positioning member 2 may be a tape, and the positioning surface 21 may be an adhesive plane. The lead frame 31 may be made by patterning a metal sheet using stamping or laser-etching techniques. In certain embodiments, a connecting end surface 310 of the frame body 311, as well as the outer end surface 315 of each of the connecting leads 312, is removably connected to the positioning surface 21 of the positioning member 2 by adhesion.

Figure 6:
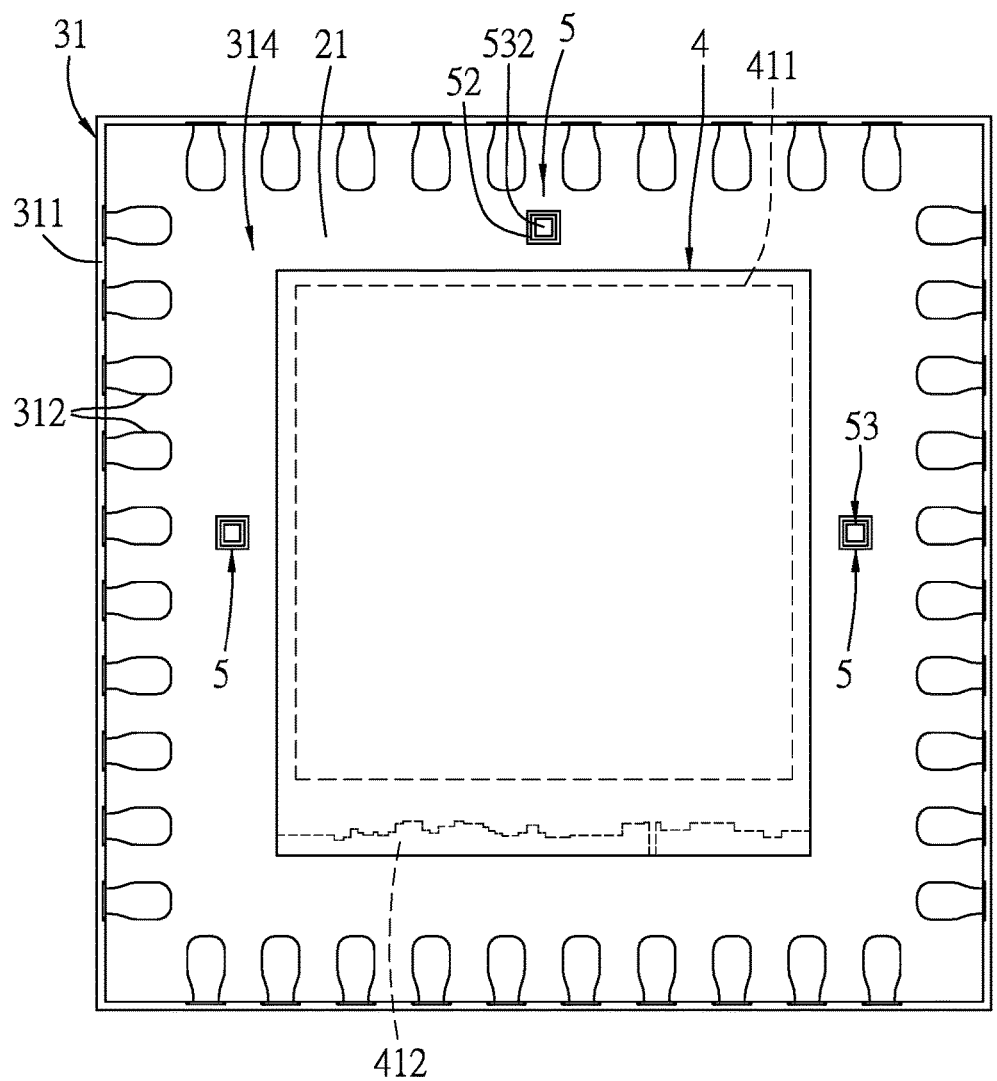
FIGS. 6 and 7 respectively are a top plan view and a sectional view of the first exemplary embodiment, illustrating a step of attaching an image-sensing die and light-emitting elements onto a positioning member.
Figure 7:
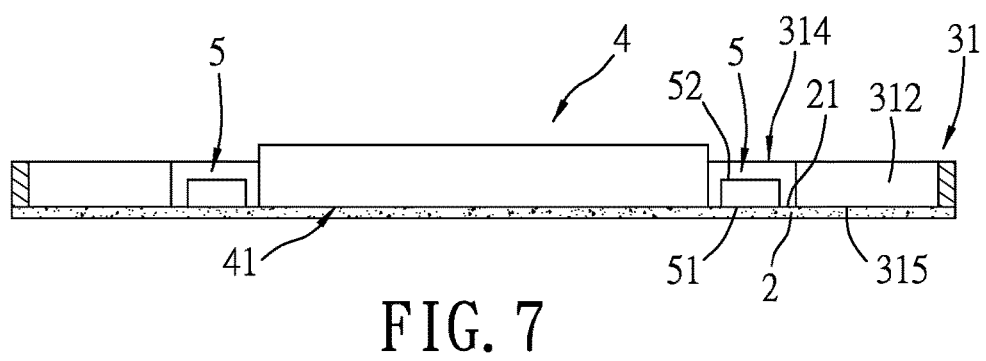

Step S2: placing an image-sensing die 4 and a plurality of light-emitting elements 5 into the accommodating space 314, and attaching the image-sensing die 4 and the light-emitting elements 5 onto the positioning surface 21 of the positioning member 2 as illustrated in FIGS. 6 and 7. The image-sensing die 4 may be a CMOS die and include an outer surface 41 having a sensing region 411 and a connecting region 412 that is spaced apart from the sensing region 411 as illustrated in FIG. 6. In certain embodiments, the image-sensing die 4 may be disposed substantially on a central portion of the positioning surface 21 as shown in FIG. 6. In certain embodiments, the light-emitting elements 5 may be configured as thin-GaN LEDs, each having an outer surface 51 that is attached to the positioning surface 21, an inner surface 52 that is opposite to the outer surface 51, and an electrode unit 53. The electrode unit 53 may include a first electrode 531 disposed on the outer surface 51, and a second electrode 532 disposed on the inner surface 52. The light-emitting elements 5 may be disposed to surround the image-sensing die 4 as illustrated in FIG. 6. It may be noted that, the number of the light-emitting elements 5 can be adjusted based on actual demands and is not limited to what is disclosed in this embodiment, e.g., to include one single light-emitting element 5 may also suffice according to the present disclosure.

Figure 8:
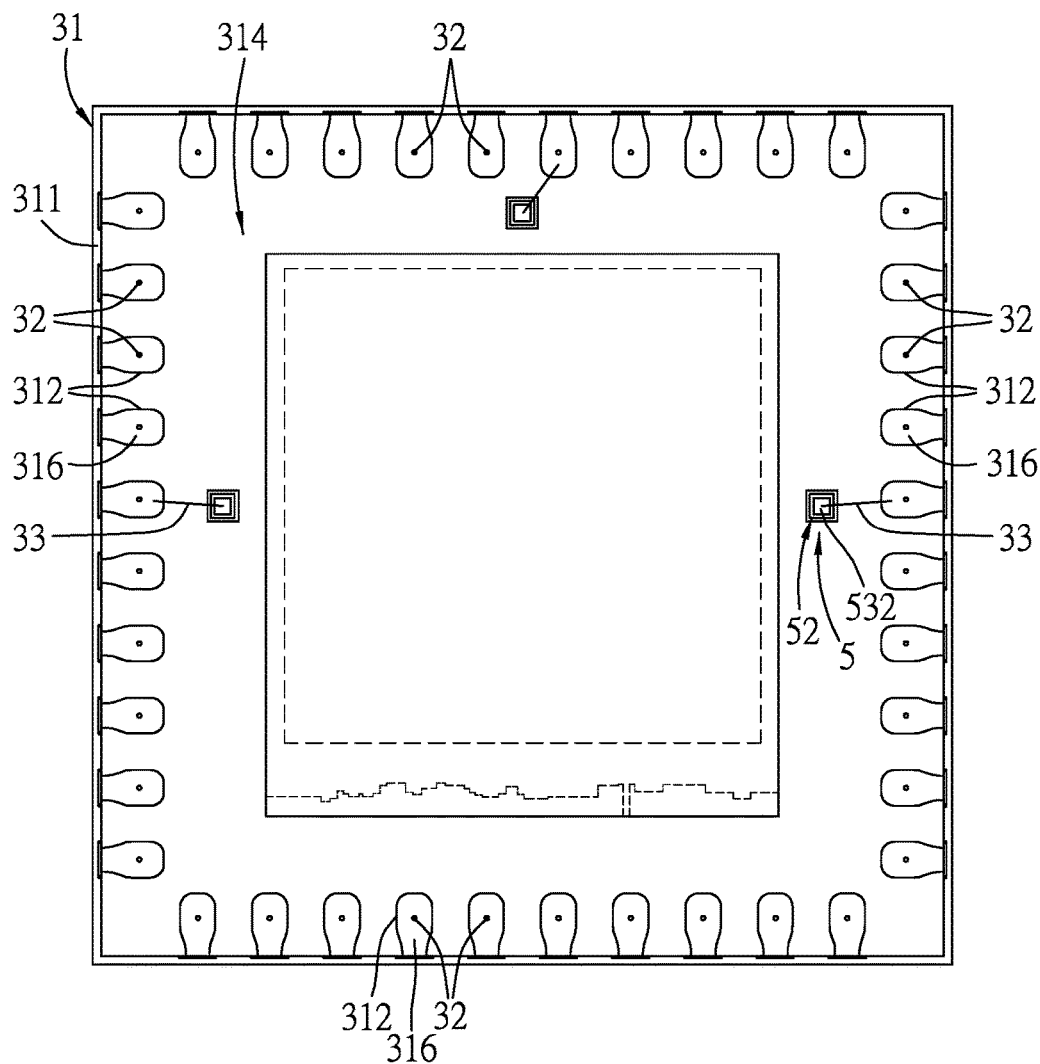
FIGS. 8 and 9 respectively are a top plan view and a sectional view of the first exemplary embodiment, illustrating a step of forming conductive elements and establishing an electrical connection between a lead frame and the light-emitting elements.
Figure 9:
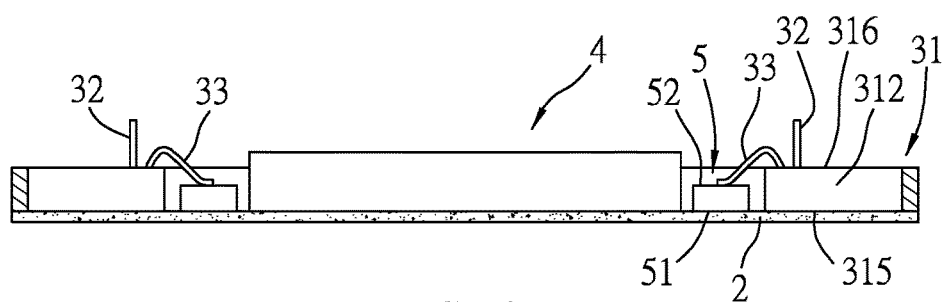

Step S3: forming a plurality of conductive elements 32 on the lead frame 31, and establishing an electrical connection between the second electrode 532 of each of the light-emitting elements 5 and a corresponding one of the connecting leads 312 of the lead frame 31. In certain embodiments, each of the conductive elements 32 may be formed on the connecting surface 316 of a corresponding one of the connecting leads 312 as illustrated in FIGS. 8 and 9. The conductive elements 32 may be configured as metal wires, each being perpendicular to the connecting surface 316 of the corresponding one of the connecting leads 312. The forming of the conductive elements 32 may be performed using a wire-bonding machine. In certain embodiments, the electrical connection between the second electrode 532 of each of the light-emitting elements 5 and the corresponding one of the connecting leads 312 may be established by wire-bonding, i.e., using connecting wires 33 as illustrated in FIGS. 8 and 9.

Figure 10:
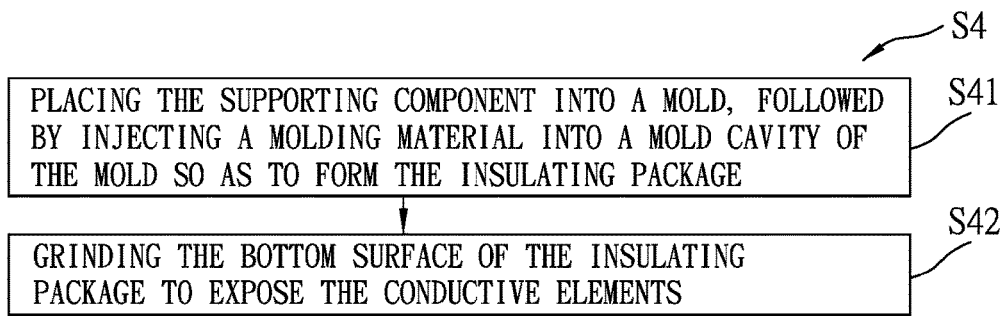
FIG. 10 is a flow chart of the first exemplary embodiment, illustrating that a step of forming an insulating package may include sub-steps.
Figure 11:
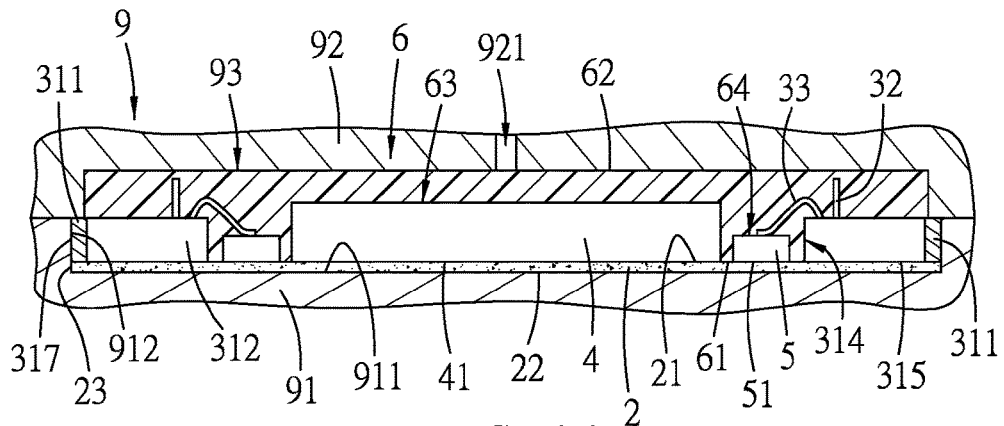
FIG. 11 is a sectional view of the first exemplary embodiment, illustrating one sub-step for forming the insulating package.
Figure 12:
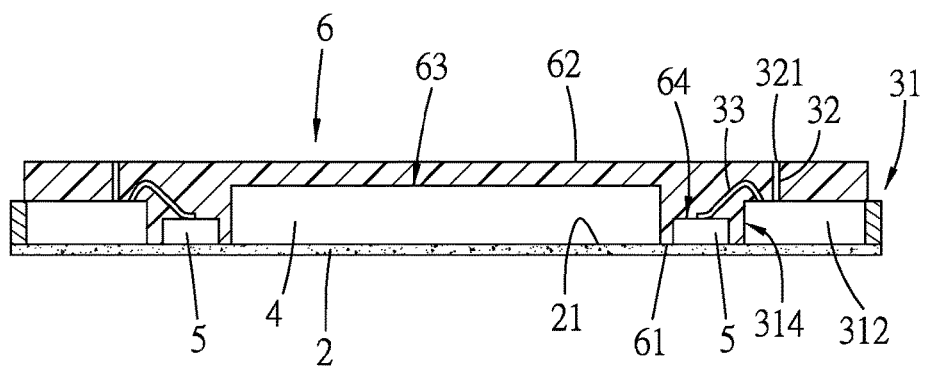
FIG. 12 is a sectional view of the first exemplary embodiment, illustrating another sub-step for forming the insulating package.

Step S4: forming an insulating package 6 to encapsulate the image-sensing die 4, the light-emitting elements 5 and the connecting leads 312 of the lead frame 31. As illustrated in FIG. 10, in certain embodiments, Step S4 may include sub-Steps S41 and S42.

sub-Step S41: placing the supporting component 20 on a bottom die 91 of a mold 9 after Step S3, where a bottom surface 22 of the positioning member 2, which is opposite to the positioning surface 21, abuts against a bottom positioning surface 911 of the bottom die 91, and an outer surrounding surface 23 of the positioning member 2, as well as an outer surrounding surface 317 of the frame body 311, abuts against a positioning surrounding surface 912 of the bottom die 91. Thereafter, the bottom die 91 is combined with a top die 92 to form a mold cavity 93 that receives the supporting component 20, after which a molding material (not shown) is injected into the mold cavity 93 through a sprue 921 of the top die 92 to fill the mold cavity 93, so as to form the insulating package 6 which encapsulates the connecting leads 312, the image-sensing die 4, the light-emitting elements 5, the conductive elements 32 and the connecting wires 33. Since the outer end surface 315 of each of the connecting leads 312, the outer surface 41 of the image-sensing die 4, and the outer surface 51 of each of the light-emitting elements 5 are attached to the positioning surface 21, the relative position of the lead frame 31, the image-sensing die 4 and the light-emitting elements 5 would not be affected during the injection of the molding material.

The insulating package 6 thus formed has a top surface 61 that is connected to the positioning surface 21 of the positioning member 2, and a bottom surface 62 that is opposite to the top surface 61 and that is formed with a first recess 63 receiving the image-sensing die 4, and a plurality of second recesses 64 each receiving a respective one of the light-emitting elements 5. It is worth noting that, in certain embodiments, the accommodating space 314 is filled by part of the insulating package 6 so as to fully encapsulate the conductive elements 32 and the connecting wires 33.

sub-Step S42: grinding the bottom surface 62 of the insulating package 6 to expose an inner end surface 321 of each of the conductive elements 32. Step S42 may be conducted using a grinding machine (not shown) to reduce the overall thickness of the insulating package 6. After sub-Step S42, the inner end surface 321 of each of the conductive elements 32 may be exposed from and coplanar with the bottom surface 62 of the insulating package 6.

Figure 13:
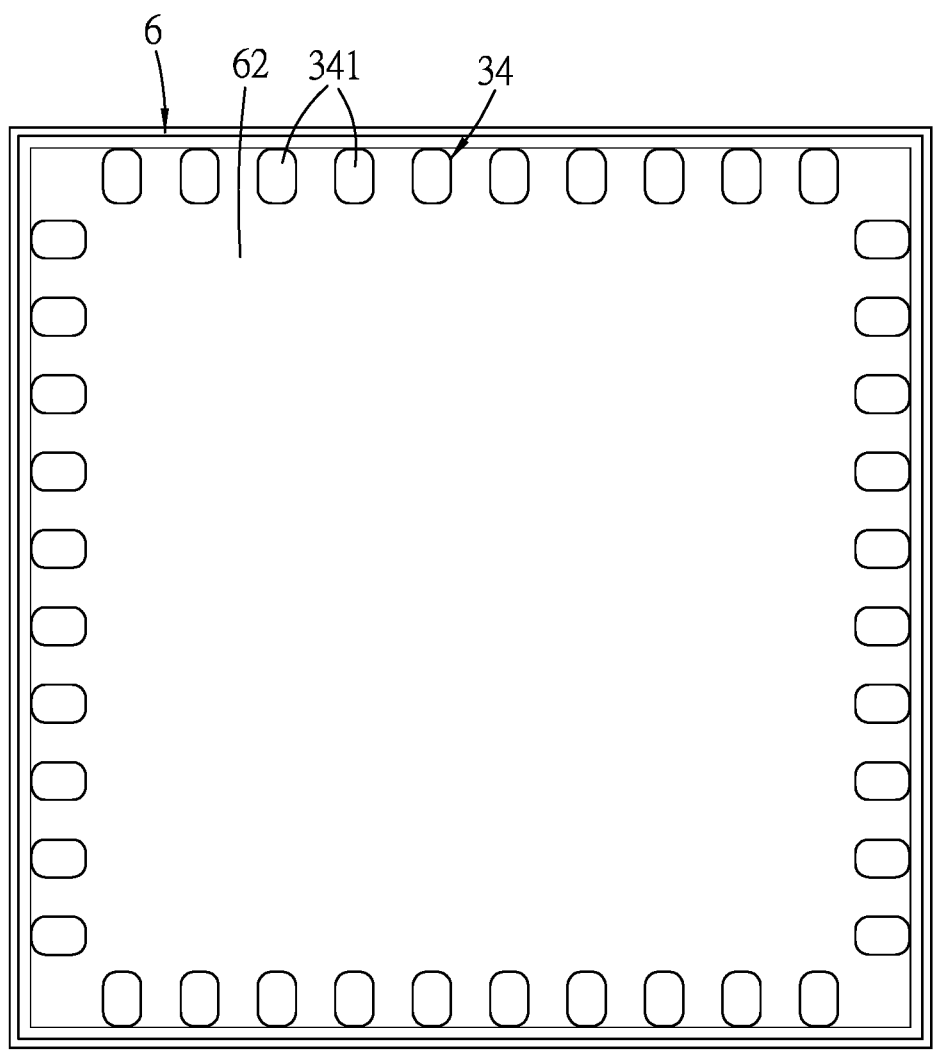
FIGS. 13 and 14 respectively are a top plan view and a sectional view of the first exemplary embodiment, illustrating a step of forming a bottom circuit pattern layer.
Figure 14:
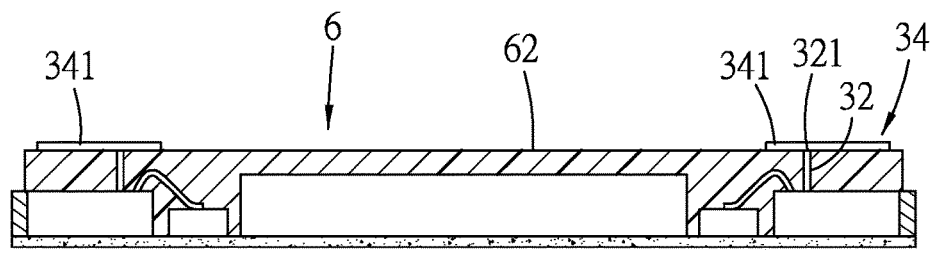

Step S5: forming a bottom circuit pattern layer 34 on the bottom surface 62 of the insulating package 6 as illustrated in FIGS. 13 and 14. The bottom circuit pattern layer 34 may be a redistribution layer (RDL) and include a plurality of connecting pads 341 each being in electrical contact with the inner end surface 321 of a corresponding one of the conductive elements 32.

Figure 15:
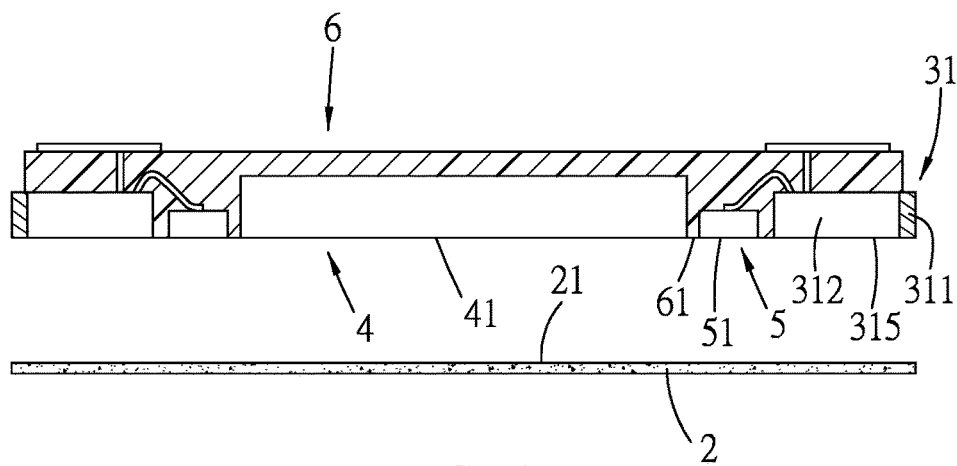
FIG. 15 is a sectional view of the first exemplary embodiment, illustrating a step of removing the positioning member from the insulating package.

Step S6: removing the positioning member 2 from the insulating package 6 as illustrated in FIG. 15, so as to expose the outer end surface 315 of each of the connecting leads 312, the outer surface 41 of the image-sensing die 4, and the outer surface 51 of each of the light-emitting elements 5 from the top surface 61 of the insulating package 6. In certain embodiments where the positioning surface 21 of the positioning member 2 is planar, as illustrated in FIG. 15, the outer end surface 315 of each of the connecting leads 312, the outer surface 41 of the image-sensing die 4, and the outer surface 51 of each of the light-emitting elements 5 are coplanar with the top surface 61 of the insulating package 6.

Figure 16:
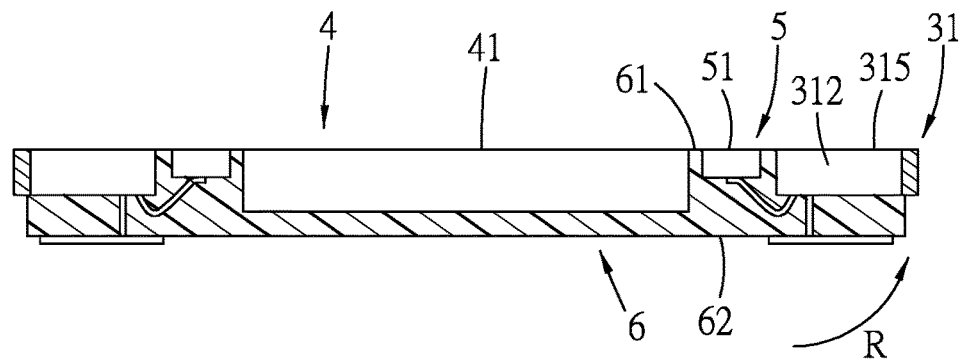
FIG. 16 is a sectional view of the first exemplary embodiment, illustrating a step of rotating the insulating package such that the top surface faces upward.
Figure 17:
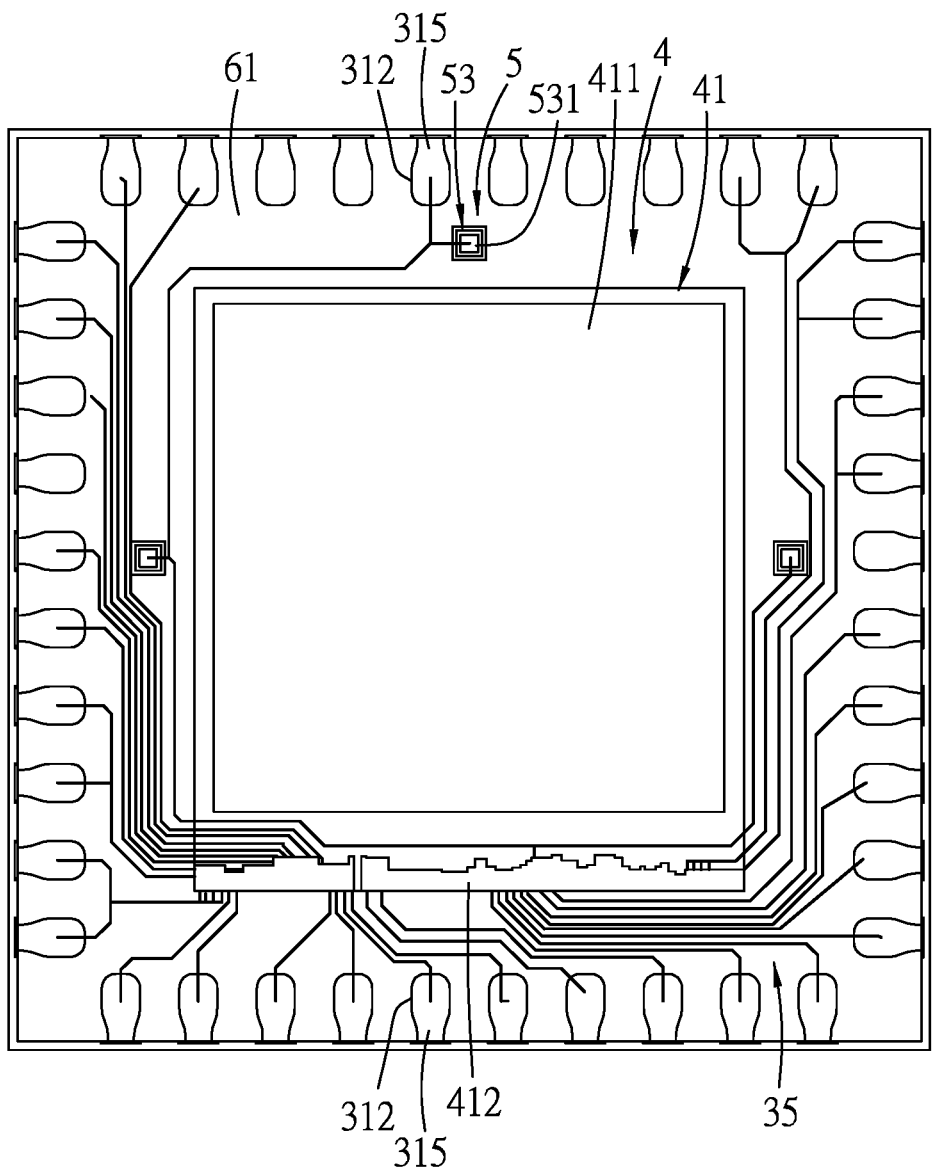
FIGS. 17 and 18 respectively are a top plan view and a sectional view of the first exemplary embodiment, illustrating a step of forming a top circuit pattern layer.
Figure 18:
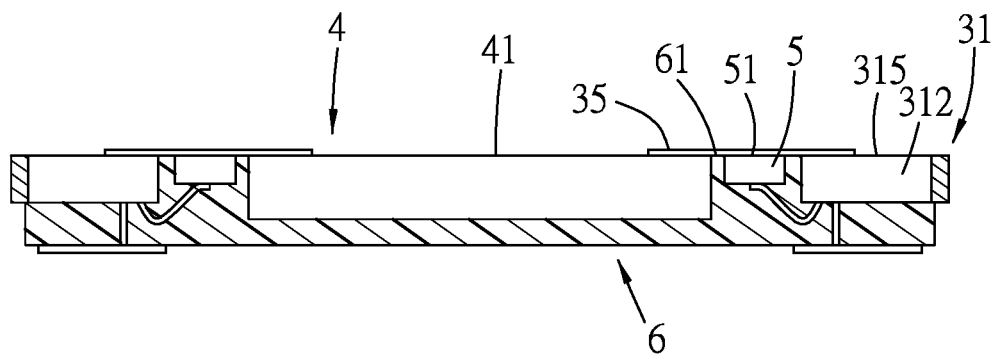

Step S7: rotating the insulating package 6 in such a manner that the top surface 61 faces upward. In certain embodiments where the bottom surface 62 of the insulating package 6 originally faces upward, the insulating package 6 may be rotated 180° along a rotating direction (R) as illustrated in FIG. 16, such that the top surface 61 of the insulating package 6, the outer end surface 315 of each of the connecting leads 312, the outer surface 41 of the image-sensing die 4, and the outer surface 61 of each of the light-emitting elements 6 face upward.

Step S8: forming a top circuit pattern layer 35 on the top surface 61 of the insulating package 6. The top circuit pattern layer 35 may be a redistribution layer (RDL) and is electrically coupled to the connecting region 412 of the image-sensing die 4 and the first electrode 531 of each of the light-emitting elements 5. In this way, the electrical connection between the connecting region 412 of the image-sensing die 4 and the outer end surface 315 of a corresponding one of the connecting leads 312 may be established via the top circuit pattern layer 35. Similarly, the electrical connection between the first electrode 531 of each of the light-emitting elements 5 and the outer end surface 315 of the corresponding one of the connecting leads 312 may also be established via the top circuit pattern layer 35.

Figure 19:
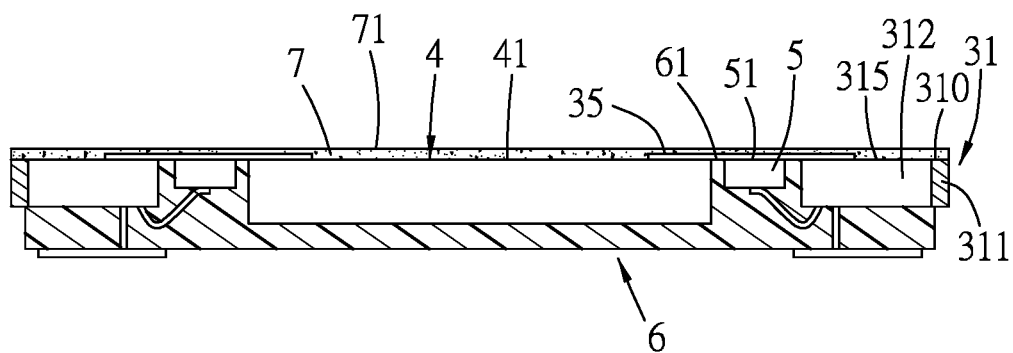
FIG. 19 is a sectional view of the first exemplary embodiment, illustrating a step of forming a light-transmissive protecting layer.

Step S9: forming a light-transmissive protecting layer 7 to cover the top surface 61 of the insulating package 6, the outer surface 41 of the image-sensing die 4, the outer surface 51 of each of the light-emitting elements 5 and the outer end surface 315 of each of the connecting leads 312 and the top circuit pattern layer 35 as illustrated in FIG. 19. The light-transmissive protecting layer 7 may have a contact plane 71 that is opposite to the insulating package 6 for finger contact of a user.

Figure 20:
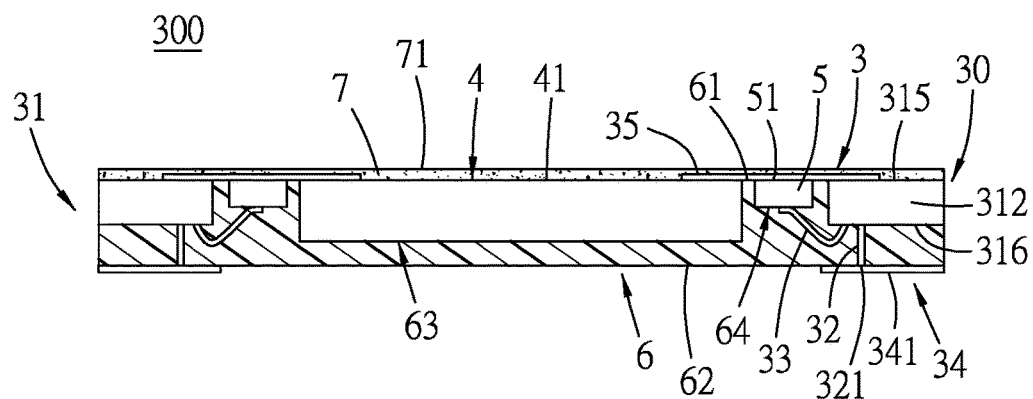
FIG. 20 is a sectional view of the first exemplary embodiment of the fingerprint sensing device.

Step S10: cutting off the frame body 311 from the connecting leads 312 so as to obtain the fingerprint sensing device 300 of the first exemplary embodiment as illustrated in FIG. 20. In certain embodiments, Step S10 may be performed using a cutting machine (not shown), and lateral portions of the insulating package 6 may be simultaneously cut off during Step S10. As shown in FIG. 20, the fingerprint sensing device 300 of the first exemplary embodiment according to the present disclosure includes a conductive component 3 including a connecting segment 30, the top circuit pattern layer 35 and the bottom circuit pattern layer 34, where the connecting segment 30 includes the connecting leads 312, the conductive elements 32 and the connecting wires 33.

The fingerprint sensing device 300 of the present disclosure has the following advantages:

(1) The utilization of the insulating package 6 to encapsulate the image-sensing die 4 and the light-emitting elements 5 allows the prism of the conventional fingerprint sensing devices to be omitted. For this reason, the fingerprint sensing device 300 of the present disclosure may be more compact in size and reduced in thickness, and thus can be applied to a wider range of electronic products, including wearable or handheld devices.

(2) The conductive elements 32 are configured as slim metal wires, so that the size of the fingerprint sensing device 300 can be further reduced.

(3) Since the outer surface 41 of the image-sensing die 4 is coplanar with the top surface 61 of the insulating package 6, a distance between the contact plane 71 of the light-transmissive protecting layer 7 and the outer surface 41 of the image-sensing die 4 can be effectively reduced.

(4) Since the outer end surface 315 of each of the connecting leads 312, the outer surface 41 of the image-sensing die 4, and the outer surface 51 of each of the light-emitting elements 5 are exposed from and coplanar with the top surface 61 of the insulating package 6, the top circuit pattern layer 35 can remain flat while having the electrical connection with the same.

(5) The method for producing the fingerprint sensing device 300 of the first exemplary embodiment is relatively simple, and thus allows for reduced production costs and production time.

(6) By incorporating the conductive component 3 into the fingerprint sensing device 300, a circuit substrate required by the conventional fingerprint sensing devices can be omitted. As such, the overall thickness of the fingerprint sensing device 300 can be further reduced. Moreover, internal stress problems caused by the difference between thermal expansion coefficients of the image-sensing die 4 and the circuit substrate can be prevented.

Figure 21:
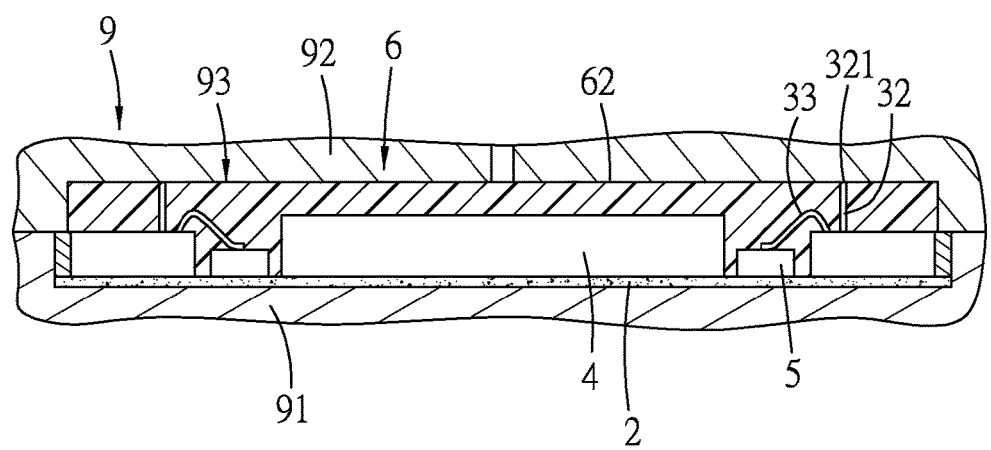
FIG. 21 is a sectional view of a second exemplary embodiment according to the present disclosure, illustrating that the conductive elements abut against a top die of a mold during the step of forming the insulating package.

Referring to FIG. 21, the second exemplary embodiment of the method for producing the fingerprint sensing device 300 is similar to that of the first exemplary embodiment, with the difference residing in that sub-Step S42 is omitted in the second exemplary embodiment. As illustrated in FIG. 21, during sub-Step S41 of the second exemplary embodiment, the inner end surface 321 of each of the conductive elements 32 abuts against the top die 91, such that the inner end surface 321 of each of the conductive elements 32 may be exposed directly after the forming of the insulating package 6 without grinding the bottom surface 62 of the insulating package 6. In certain embodiments, the amount of the molding material to be injected into the mold cavity 93 may be controlled, so that the inner end surface 321 of each of the conductive elements 32 would not have to be submerged by the molding material during sub-Step 41, allowing the same to be directly exposed from the bottom surface 62 of the insulating package 6.

Figure 22:
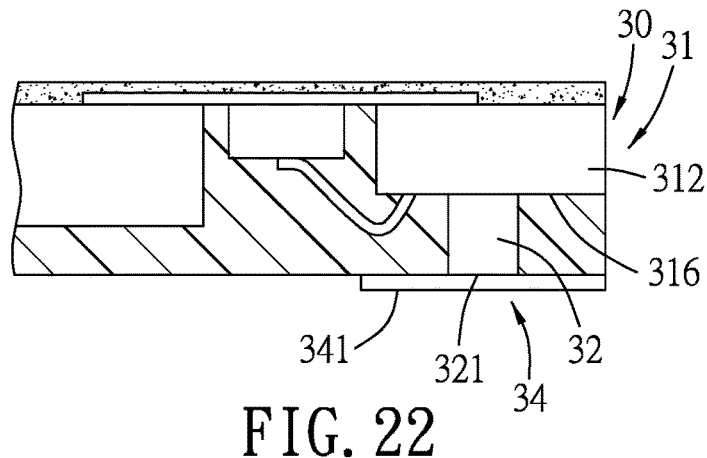
FIG. 22 is a fragmentary sectional view of a third exemplary embodiment according to the present disclosure, illustrating the configuration of the conductive elements.

Referring to FIG. 22, the third exemplary embodiment of the fingerprint sensing device 300 and the method for producing the same according to the present disclosure are similar to those of the first exemplary embodiment, with the difference residing in that the conductive elements 32 of the third exemplary embodiment are configured as metal rods which may be formed on the connecting surface 316 of each of the connecting leads 312 by electroplating.

Figure 23:
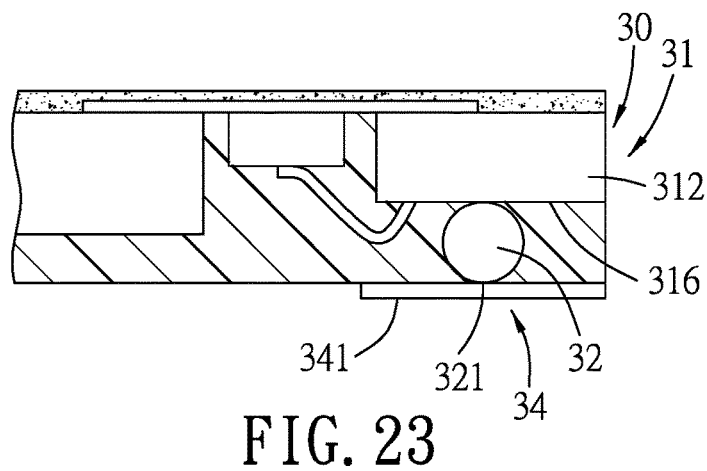
FIG. 23 is a fragmentary sectional view of a fourth exemplary embodiment according to the present disclosure, illustrating the configuration of the conductive elements.

Referring to FIG. 23, the fourth exemplary embodiment of the fingerprint sensing device 300 and the method for producing the same according to the present disclosure are similar to those of the first exemplary embodiment, with the difference residing in that the conductive elements 32 of the fourth exemplary embodiment are configured as metal bumps that may be formed on the connecting surface 316 of the connecting leads 312 by soldering.

Figure 24:
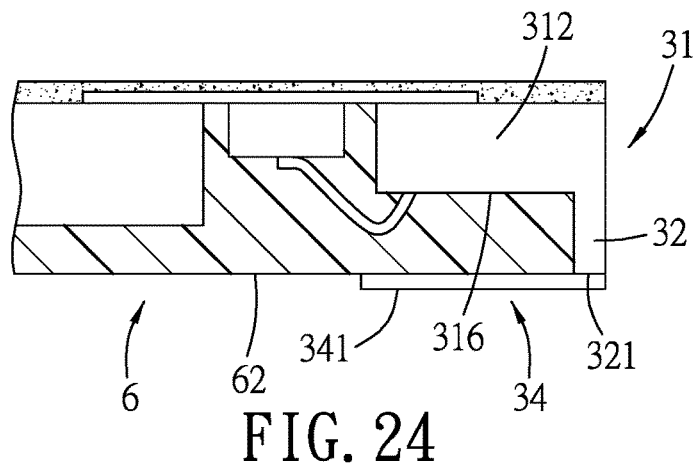
FIG. 24 is a fragmentary sectional view of a fifth exemplary embodiment according to the present disclosure, illustrating the configuration of the conductive elements.

Referring to FIG. 24, the fifth exemplary embodiment of the fingerprint sensing device 300 and the method for producing the same according to the present disclosure are similar to those of the first exemplary embodiment, with the difference residing as follows.

In the fifth exemplary embodiment, each of the conductive elements 32 and a corresponding one of the connecting leads 312 are integrally formed as one piece. For instance, each of the conductive elements 32 may be formed by bending a tip portion of the corresponding one of the connecting leads 312 as illustrated in FIG. 24, so that the forming of the conductive elements 32 using the wire bonding machine in Step S3 of the first exemplary embodiment may be omitted.

Figure 25:
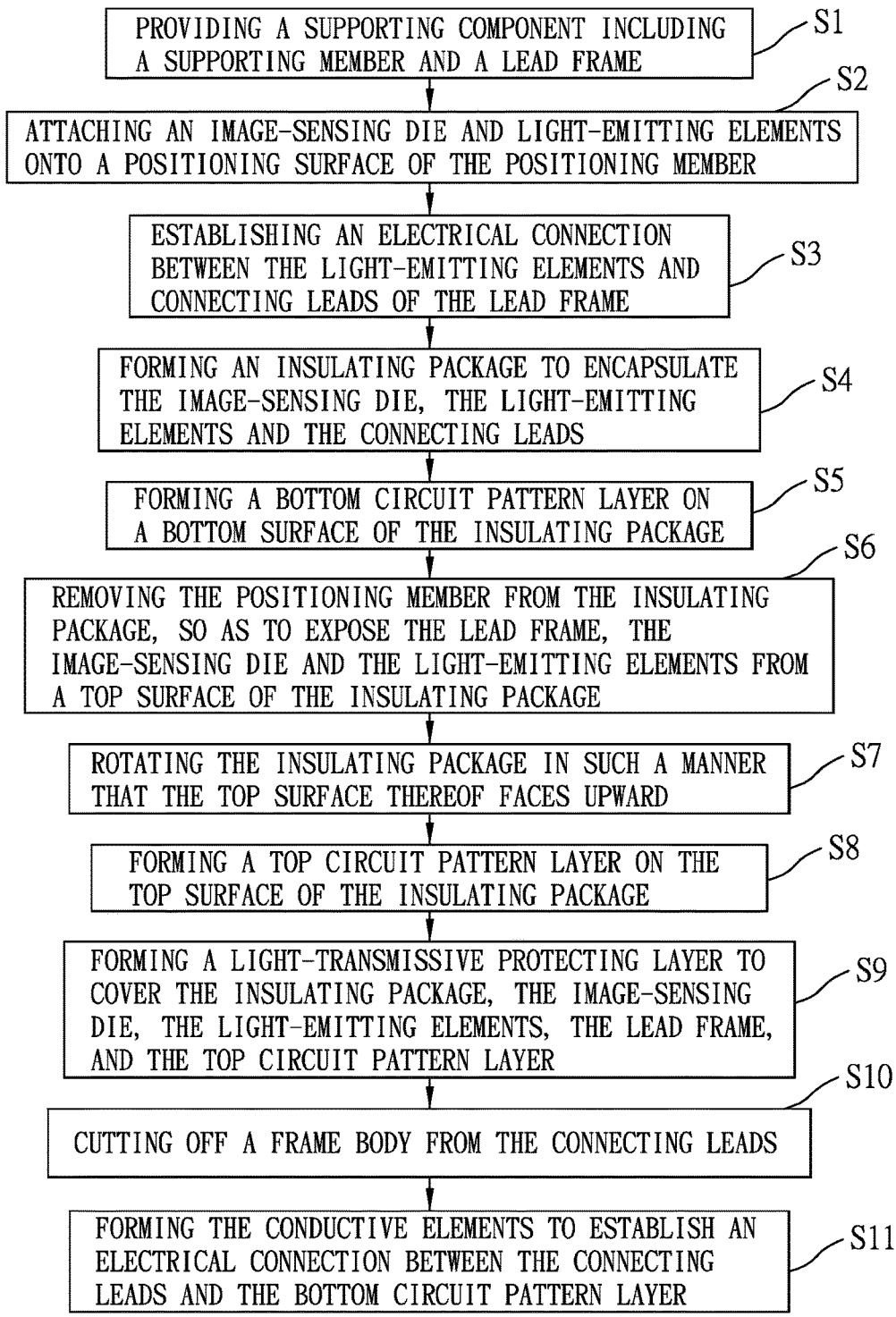
FIG. 25 is a flow chart of a sixth exemplary embodiment of the method for producing the fingerprint sensing device according to the present disclosure.
Figure 26:
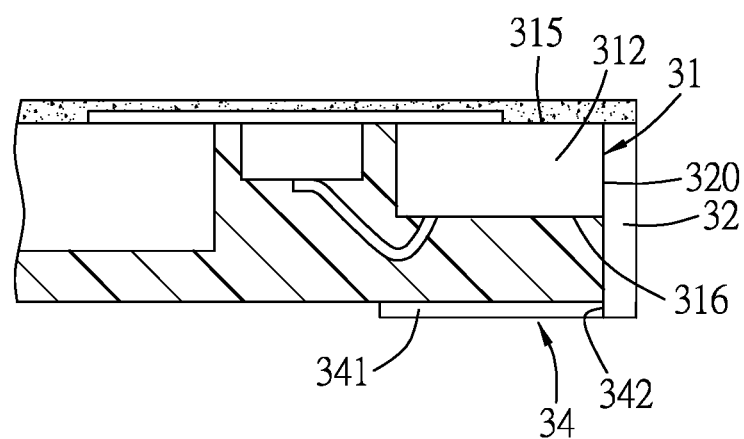
FIG. 26 is a fragmentary sectional view of the sixth exemplary embodiment, illustrating the configuration of the conductive elements.

Referring to FIGS. 25 and 26, the sixth exemplary embodiment of the fingerprint sensing device 300 and the method for producing the same according to the present disclosure are similar to those of the first exemplary embodiment, with the differences residing as follows.

In the sixth exemplary embodiment, each of the conductive elements 32 is configured as a metal layer formed on a lateral surface 320 of the corresponding one of the connecting leads 312, an outer lateral surface of the insulating package 6, and a lateral surface 342 of a corresponding one of the connecting pads 341, so as to establish an electrical connection between each of the connecting leads 312 and the corresponding one of the connecting pads 341, i.e., to electrically and correspondingly interconnect the connecting leads 312 and the connecting pads 341. Accordingly, the forming of the conductive elements 32 in Step S3 may be omitted, and the method of the sixth exemplary embodiment may further include a Step S11 of forming the conductive elements 32 by, e.g., electrochemical metal deposition, after Step S10.

Figure 27:
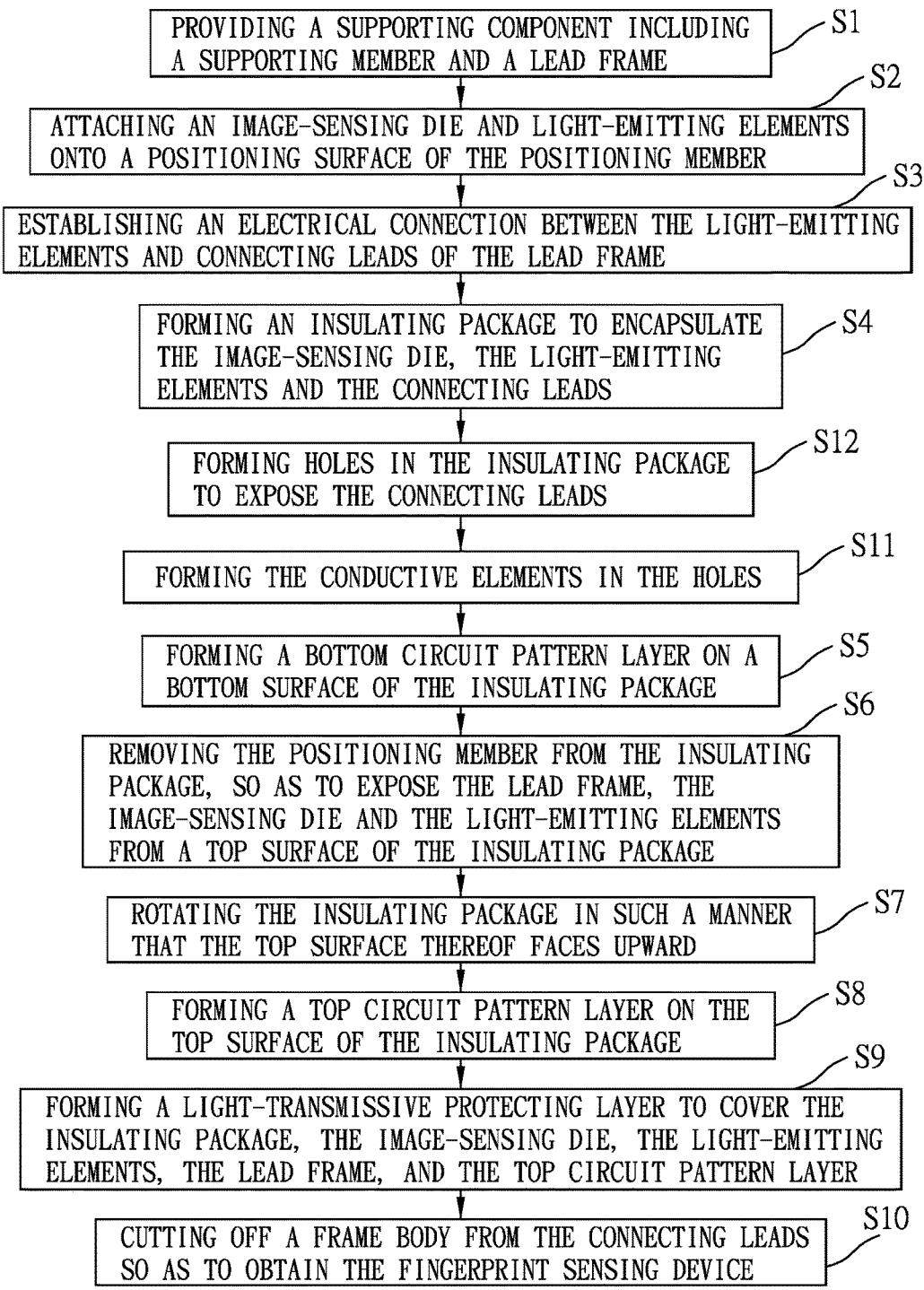
FIG. 27 is a flow chart of a seventh exemplary embodiment of the method for producing the fingerprint sensing device according to the present disclosure.
Figure 28:
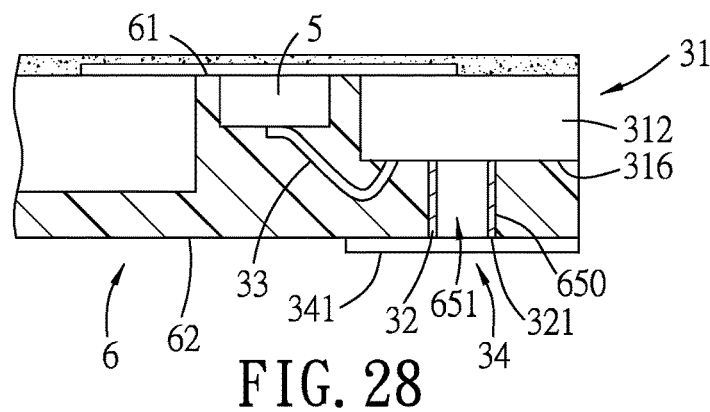
FIG. 28 is a fragmentary sectional view of the seventh exemplary embodiment, illustrating the configuration of the conductive elements.

Referring to FIGS. 27 and 28, the seventh exemplary embodiment of the fingerprint sensing device 300 and the method for producing the same are similar to those of the first exemplary embodiment, with the difference residing as follows.

In the seventh exemplary embodiment, the forming of the conductive elements 32 in Step S3 is omitted, and the method further includes a Step S12 of forming a plurality of holes 651 (only one is shown in FIG. 28) in the insulating package 6 to expose the connecting surface 316 of each of the connecting leads 312, and a Step S11 of forming the conductive elements 32 respectively in the holes 651. As illustrated in FIG. 28, each of the holes 651 extends from the connecting surface 316 of a respective one of the connecting leads 312 to the bottom surface 62 of the insulating package 6 and is defined by a surrounding surface 650. Each of the conductive elements 32 is configured as a metal layer formed on the surrounding surface 650 in a respective one of the holes 651. Step S12, i.e., the forming of the holes 651, may be performed by laser drilling, and Step S11, i.e., the forming of the conductive elements 32, may be conducted by electroplating.

Figure 29:
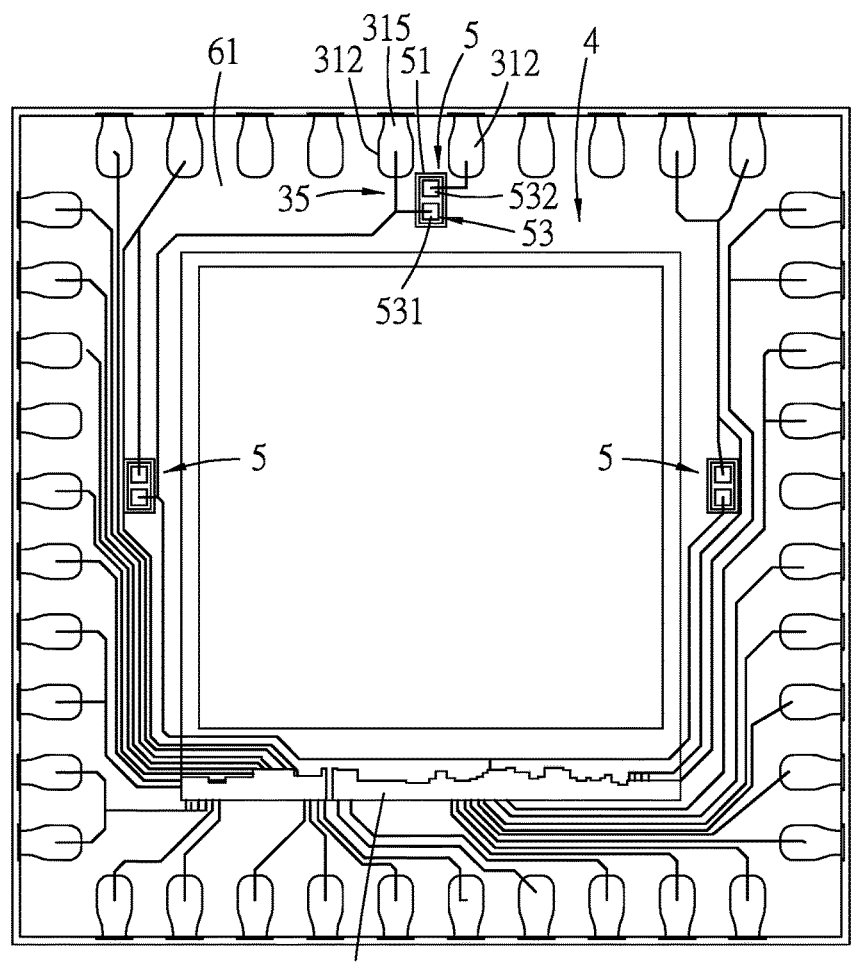
FIG. 29 is a top plan view of an eighth exemplary embodiment of the fingerprint sensing device according to the present disclosure.
Figure 30:
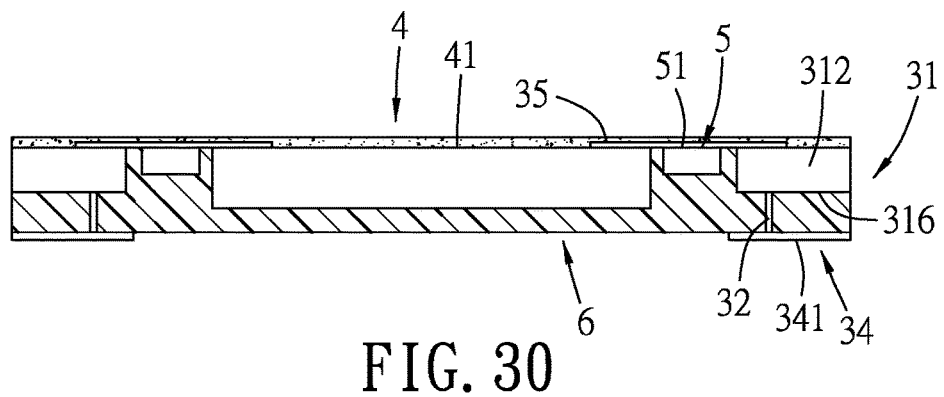
FIG. 30 is a sectional view of the eighth exemplary embodiment, illustrating the configuration of the light-emitting elements.

Referring to FIGS. 29 and 30, the eighth exemplary embodiment of the fingerprint sensing device 300 and the method for producing the same according to the present disclosure are similar to those of the first exemplary embodiment, with the differences residing as follows.

In the eighth exemplary embodiment, each of the light-emitting elements 5 is configured as a sapphire-based LED having the first and second electrodes 531, 532 both being formed on the outer surface 51 as illustrated in FIG. 29. Accordingly, after Step S8, the top circuit pattern layer 35 is electrically coupled to the first and second electrodes 531, 532 of each of the light-emitting elements 5, as well as to the connecting leads 312 of the lead frame 31. In other words, the top circuit pattern layer 35 electrically interconnects the first and second electrodes 531, 532 of the light-emitting elements 5 and the connecting leads 312 of the lead frame 31. As such, Step S3 only includes the forming of the conductive elements 32 in the eighth exemplary embodiment.

Figure 31:
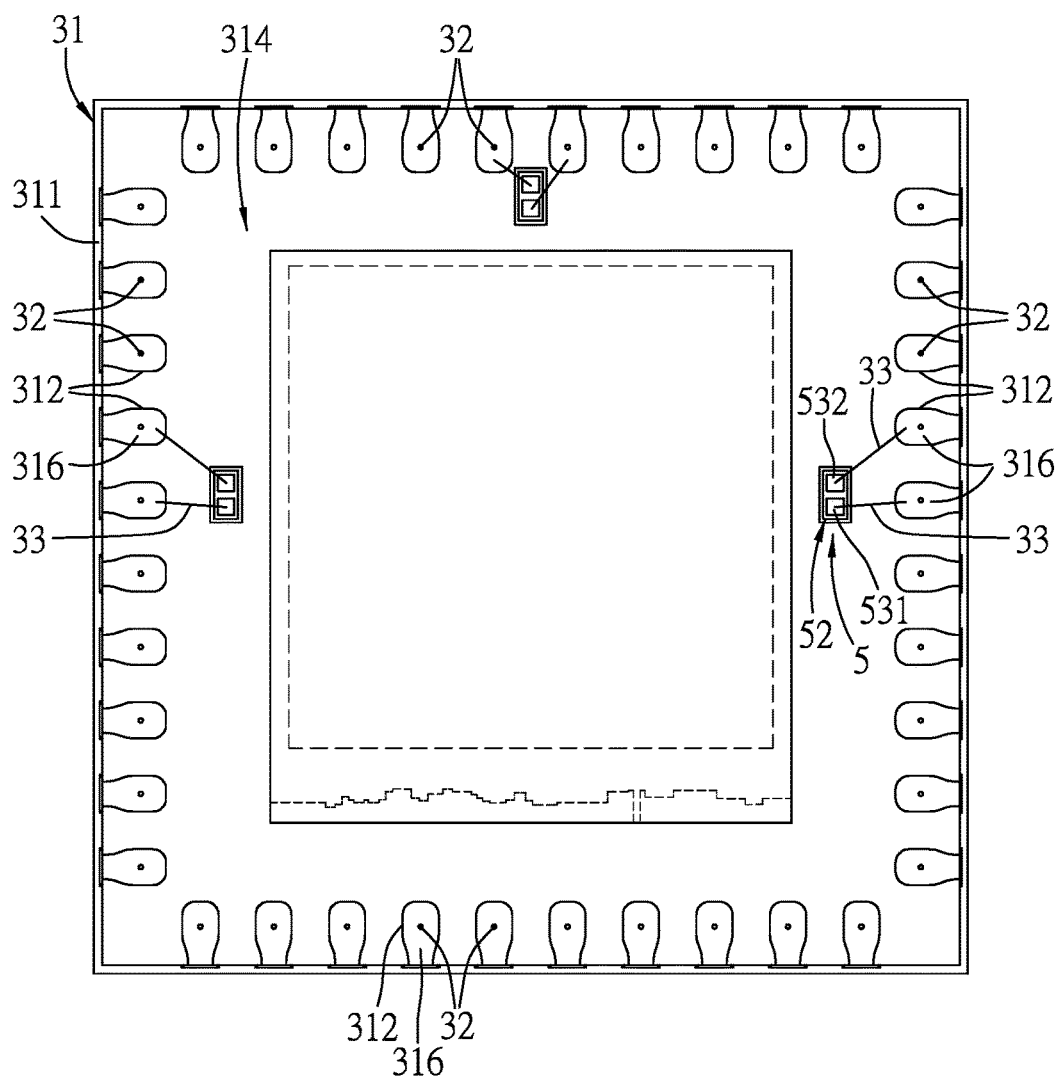
FIG. 31 is a top plan view of a ninth exemplary embodiment of the fingerprint sensing device according to the present disclosure.
Figure 32:
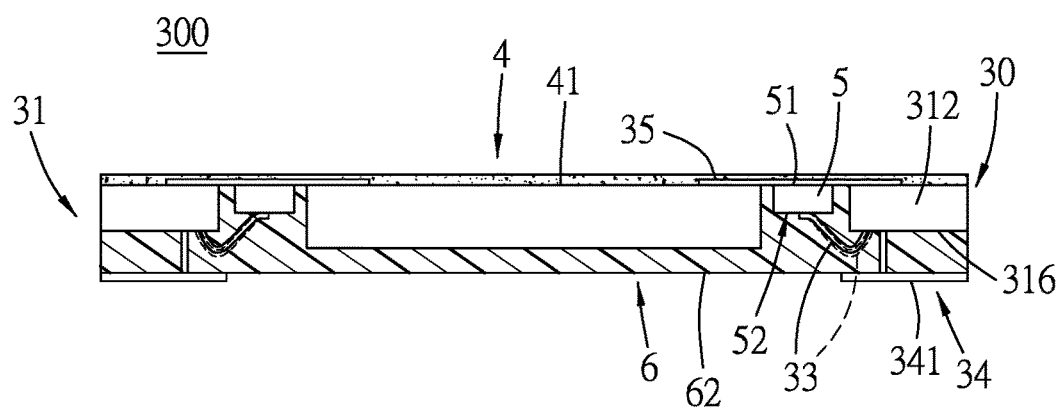
FIG. 32 is a sectional view of the ninth exemplary embodiment, illustrating the configuration of the light-emitting elements.

Referring to FIGS. 31 and 32, the ninth exemplary embodiment of the fingerprint sensing device 300 and the method for producing the same according to the present disclosure are similar to those of the first exemplary embodiment, with the difference residing in the configuration of the light-emitting elements 5.

In the ninth exemplary embodiment, each of the light-emitting elements 5 is configured as a sapphire-based LED having the first and second electrodes 531, 532 both being formed on the inner surface 52 thereof. Accordingly, Step S3 further includes a step of establishing an electrical connection between the first electrode 531 of each of the light-emitting elements 5 and a corresponding one of the connecting leads 312 of the lead frame 31.

Figure 33:
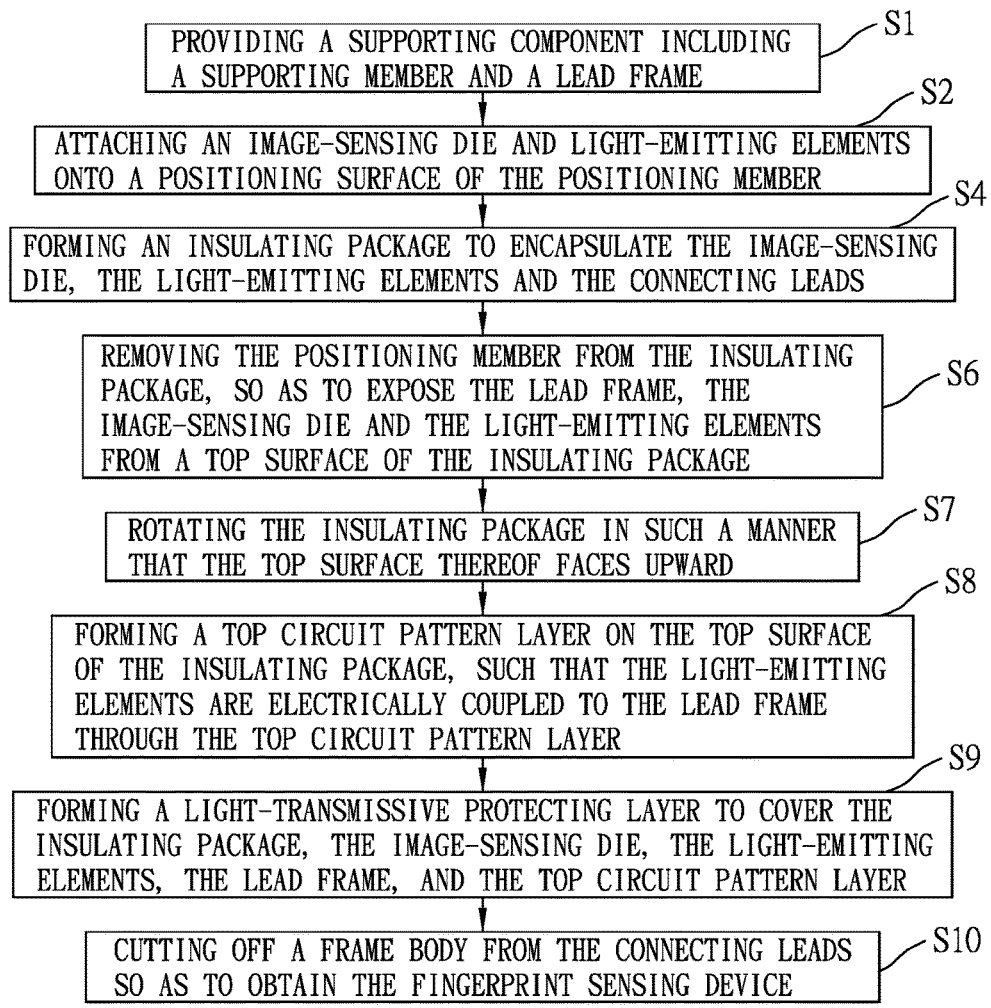
FIG. 33 is flow chart of a tenth exemplary embodiment of the method for producing the fingerprint sensing device according to the present disclosure.
Figure 34:
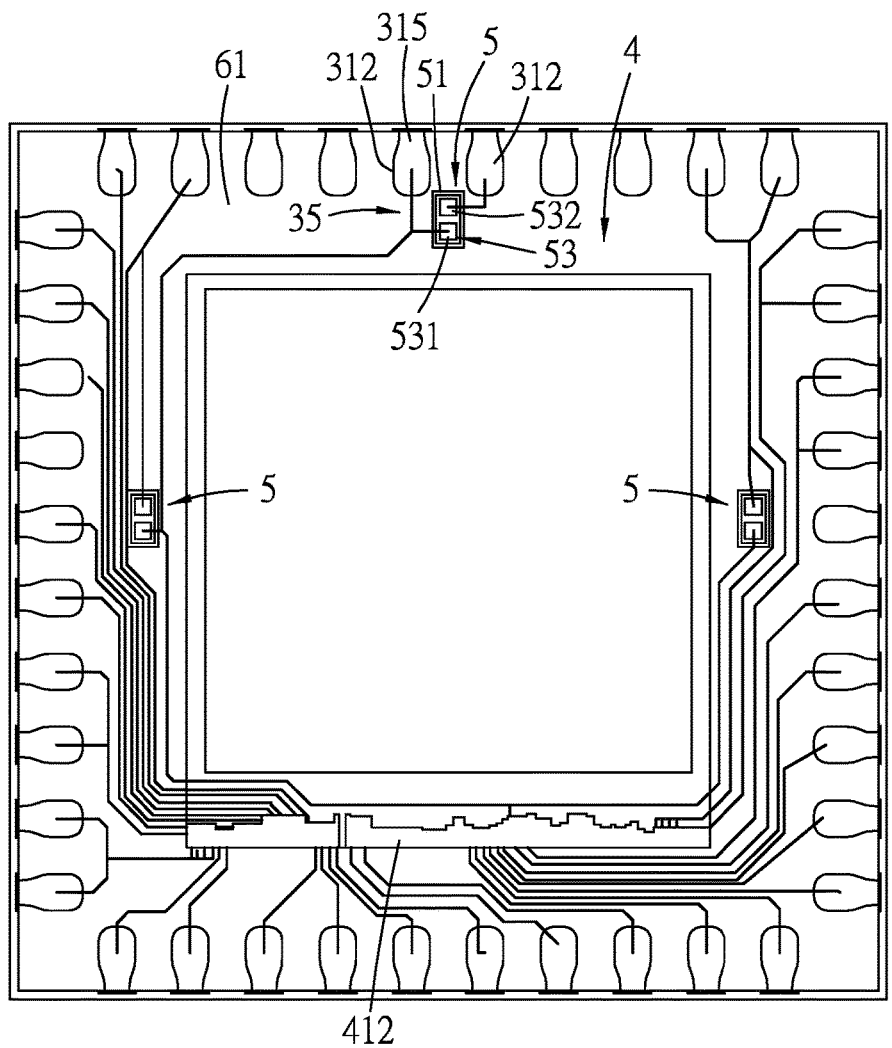
FIG. 34 is a top plan view of the tenth exemplary embodiment, illustrating the configuration of the light-emitting elements.
Figure 35:
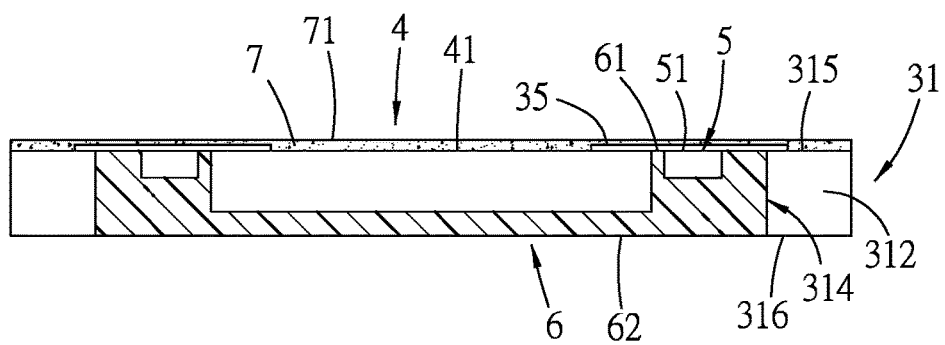
FIG. 35 is a sectional view of the tenth exemplary embodiment, illustrating the configuration of the connecting segment.

Referring to FIGS. 33, 34 and 35, the tenth exemplary embodiment of the fingerprint sensing device 300 and the method for producing the same according to the present disclosure are similar to those of the first exemplary embodiment, with the difference residing in the configuration of the light-emitting elements 5 and the lead frame 31.

In the tenth exemplary embodiment, the configuration of the light-emitting elements 5 is identical to that of the eighth exemplary embodiment, where each of the light-emitting elements 5 is configured as a sapphire-based LED having the first and second electrodes 531, 532 both being formed on the outer surface 51. The lead frame 31 of the tenth exemplary embodiment has a thickness greater than that in the first exemplary embodiment, so that the connecting surface 316 of each of the connecting leads 312 is exposed from the insulating package 6. Accordingly, the method of this embodiment omits Steps S3 and S5. Moreover, during Step S8, the first and second electrodes 531, 532 of each of the light-emitting elements 5 is electrically coupled to the top circuit pattern layer 35, so that the light-emitting elements 5 can be electrically coupled to the connecting leads 312 of the lead frame 31 through the top circuit pattern layer 35.

Figure 36:
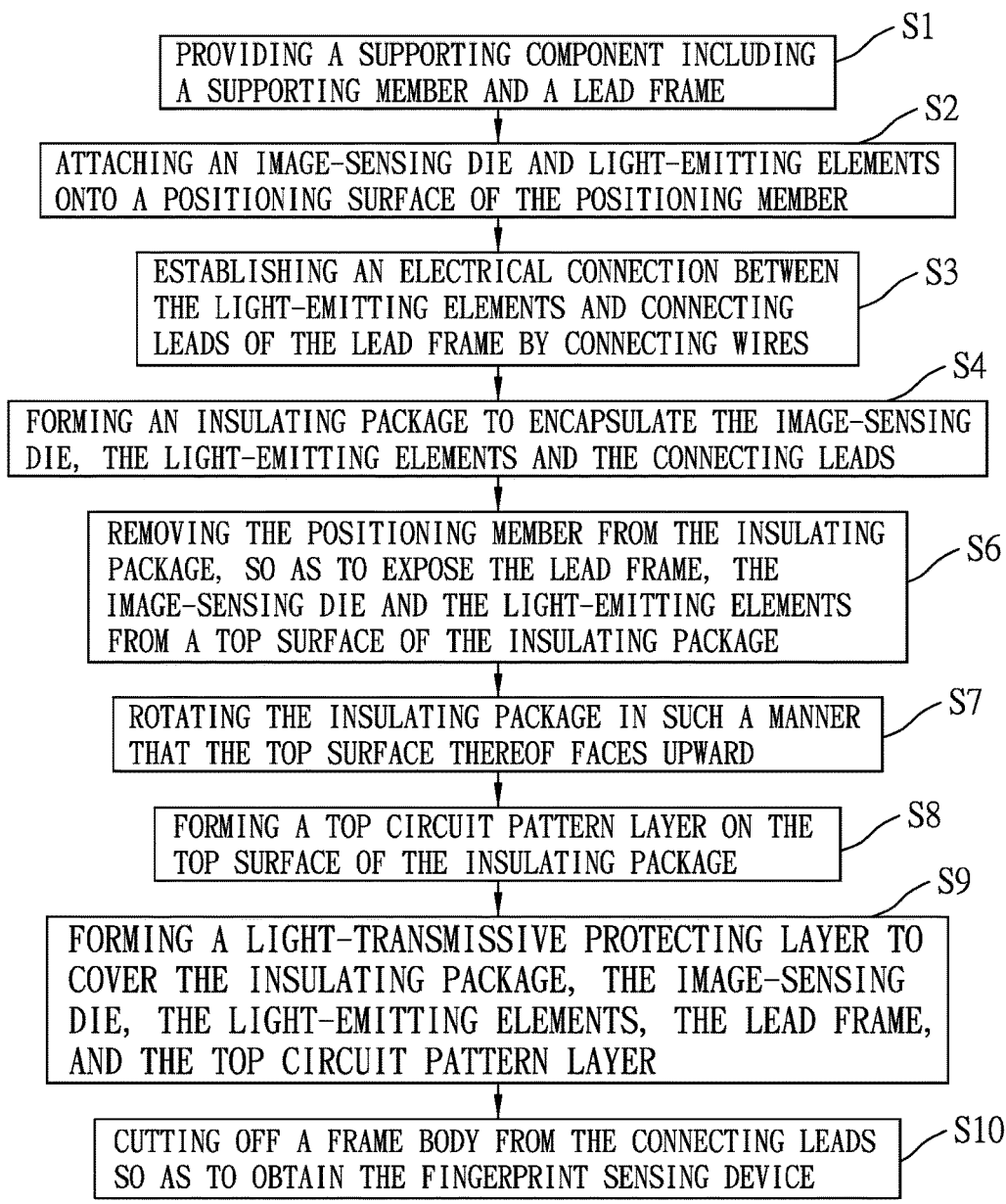
FIG. 36 is a flow chart of an eleventh exemplary embodiment of the method for producing the fingerprint sensing device according to the present disclosure.
Figure 37:
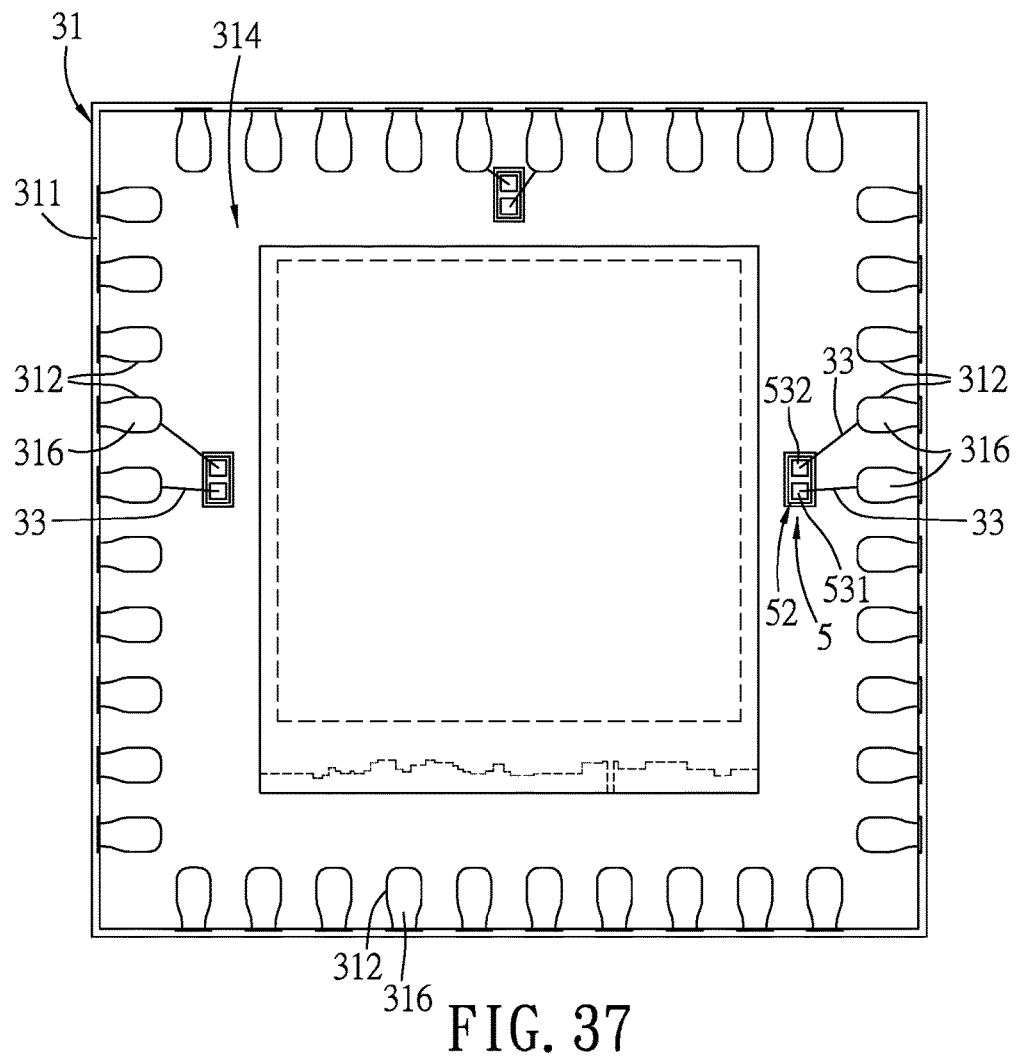
FIG. 37 is a top plan view of the eleventh exemplary embodiment, illustrating the configuration of the connecting segment.
Figure 38:
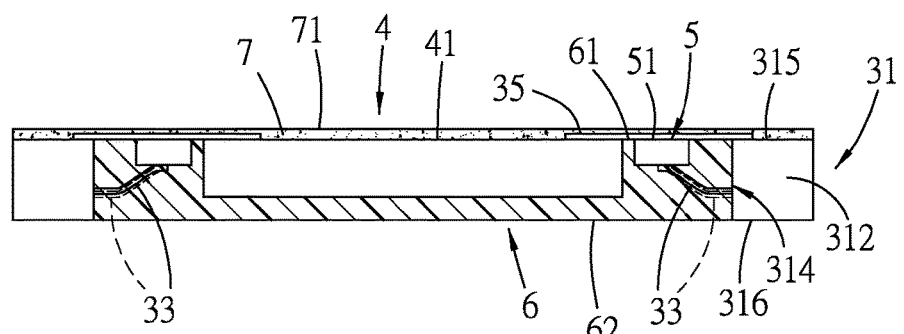
FIG. 38 is a sectional view of the eleventh exemplary embodiment.

Referring to FIGS. 36, 37 and 38, the eleventh exemplary embodiment of the fingerprint sensing device 300 and the method for producing the same according to the present disclosure are similar to those of the tenth exemplary embodiment, with the difference residing in the configuration of the light-emitting elements 5.

In the eleventh exemplary embodiment, each of the light-emitting elements 5 is configured as a sapphire-based LED, where the first and second electrodes 531, 532 are both formed on the inner surface 52. Accordingly, Step S3 only includes, for each light-emitting element 5, providing a pair of connecting wires 33, each of which has one end electrically coupled to a corresponding one of the connecting leads 312 of the lead frame 31, and the other end electrically coupled to a respective one of the first and second electrodes 531, 532, so that the light-emitting elements 5 are electrically coupled to the connecting leads 312.

In summary, the utilization of the insulating package 6 to encapsulate the image-sensing die 4 and the light-emitting elements 5 allows the prism of conventional fingerprint sensing devices to be omitted in the present disclosure. As such, the fingerprint sensing device 300 of the present disclosure may be more compact in size and reduced in thickness, and thus can be applied to a wider range of electronic products, including wearable or handheld devices. Moreover, since the outer surface 41 of the image-sensing die 4 is coplanar with the top surface 61 of the insulating package 6, a distance between the contact plane 71 of the light-transmissive protecting layer 7 and the outer surface 41 of the image-sensing die 4 can be effectively reduced, so that the fingerprint sensing device 300 of the present disclosure may have enhanced sensitivity. Furthermore, since the outer end surface 315 of each of the connecting leads 312, the outer surface 41 of the image-sensing die 4, and the outer surface 51 of each of the light-emitting elements 5 are exposed from and coplanar with the top surface 61 of the insulating package 6, the top circuit pattern layer 35 can remain flat while having the electrical connection with the same. Furthermore, the method for producing the fingerprint sensing device 300 is relatively simple, and thus allows for reduced production costs and production time. Still further, by incorporating the conductive component 3 into the fingerprint sensing device 300, a circuit substrate required by the conventional fingerprint sensing devices can be omitted. As such, the overall thickness of the fingerprint sensing device 300 can be further reduced. Moreover, the internal stress problems caused by the difference between thermal expansion coefficients of the image-sensing die 4 and the circuit substrate can be prevented.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A fingerprint sensing device, comprising:
an insulating package having
a top surface that is formed with a first recess and a second recess, and
a bottom surface that is opposite to said top surface;
an image-sensing die disposed in said first recess and having an outer surface that is exposed from said first recess and that includes a sensing region and a connecting region;
a light-emitting element disposed in said second recess and having an outer surface that is exposed from said second recess, and an electrode unit; and a conductive component formed in said insulating package and having opposite top and bottom ends that are respectively exposed from said top and bottom surfaces of said insulating package, said conductive component being electrically coupled to said connecting region of said image-sensing die and said electrode unit of said light-emitting element.

2. The fingerprint sensing device according to claim 1, wherein an outer surface of said light-emitting element and said outer surface of said image-sensing die are coplanar with said top surface of said insulating package.

3. The fingerprint sensing device according to claim 2, wherein said conductive component includes a top circuit pattern layer that is formed on said top surface of said insulating package, that has said top end of said conductive component, and that is electrically coupled to said electrode unit of said light-emitting element and said connecting region of said image-sensing die.

4. The fingerprint sensing device according to claim 3, wherein said conductive component further includes a connecting segment extending between said top and bottom surfaces in said insulating package and having an outer end surface that is exposed from and coplanar with said top surface of said insulating package, and that is electrically coupled to said top circuit pattern layer.

5. The fingerprint sensing device according to claim 4, wherein:
said conductive component further includes a bottom circuit pattern layer that is provided with said bottom end of said conductive component and that is formed on said bottom surface of said insulating package; and
said connecting segment of said conductive component includes a lead frame having at least one connecting lead that has said outer end surface, and a conductive element that electrically interconnects said connecting lead and said bottom circuit pattern layer.

6. The fingerprint sensing device according to claim 5, wherein:
said connecting lead further has a connecting surface that is opposite to said outer end surface; and
said conductive element is electrically coupled to said connecting lead at said connecting surface and has an inner end surface that is exposed from and co-planar with said bottom surface of said insulating package.

7. The fingerprint sensing device according to claim 6, wherein said conductive element is a metal wire.

8. The fingerprint sensing device according to claim 6, wherein said conductive element is a metal rod.

9. The fingerprint sensing device according to claim 6, wherein said conductive element is a metal bump.

10. The fingerprint sensing device according to claim 6, wherein:
said bottom surface of said insulating package is formed with a hole that extends from said connecting surface of said connecting lead to said bottom surface to expose said connecting surface of said connecting lead and that is defined by a surrounding surface; and
said conductive element is configured as a metal layer formed on said surrounding surface in said hole.

11. The fingerprint sensing device according to claim 6, wherein said connecting lead and said conductive element are integrally formed as one piece.

12. The fingerprint sensing device according to claim 5, wherein:
said insulating package further has an outer lateral surface interconnecting said top and bottom surfaces;

said connecting lead has a lateral surface that is connected to said outer end surface and that is exposed from said outer lateral surface of said insulating package; and
said conductive element is configured as a metal layer formed on said lateral surface of said connecting lead and said outer lateral surface of said insulating package to electrically interconnect said connecting lead and said bottom circuit pattern layer.

13. The fingerprint sensing device according to claim 5, wherein:
said light-emitting element is a thin-GaN LED and has an inner surface that is opposite to said outer surface;
said electrode unit includes
a first electrode that is disposed on said outer surface of said light-emitting element and that is electrically coupled to said top circuit pattern layer, and
a second electrode that is disposed on said inner surface of said light-emitting element; and
said connecting segment further includes a connecting wire electrically interconnecting said connecting lead and said second electrode.

14. The fingerprint sensing device according to claim 5, wherein said light-emitting element is a sapphire-based LED, and said electrode unit includes first and second electrodes that are disposed on said outer surface of said light-emitting element and that are electrically coupled to said top circuit pattern layer.

15. The fingerprint sensing device according to claim 5, wherein:
said light-emitting element is a thin-GaN LED and has an inner surface that is opposite to said outer surface;
said electrode unit includes first and second electrodes that are disposed on said inner surface of said light-emitting element; and
said connecting segment further includes a pair of connecting wires, each of which electrically interconnects said connecting lead and a respective one of said first and second electrodes.

16. The fingerprint sensing device according to claim 4, wherein said connecting segment includes a lead frame having at least one connecting lead that has
said outer end surface, and
a connecting surface which is opposite to said outer end surface and which is exposed from and coplanar with said bottom surface of said insulating package.

17. The fingerprint sensing device according to claim 4, further comprising a light-transmissive protecting layer covering said top surface of said insulating package, said outer end surface of said connecting segment, said outer surface of said light-emitting element, said outer surface of said image-sensing die and said top circuit pattern layer, said light-transmissive protecting layer having a contact plane that is opposite to said insulating package.

18. A method for producing a fingerprint sensing device, comprising the steps of:
providing a supporting component including a positioning member that has a positioning surface, and a lead frame that is connected to the positioning surface;
attaching an image-sensing die and a light-emitting element onto the positioning surface of the positioning member;
forming an insulating package to encapsulate the image-sensing die, the light-emitting element and the lead frame, wherein the insulating package has a top surface that is connected to the positioning surface of the positioning member, and a bottom surface that is opposite to the top surface;

removing the positioning member from the insulating package, so as to expose the lead frame, the image-sensing die and the light-emitting element from the top surface of the insulating package; and forming a top circuit pattern layer on the top surface of the insulating package, such that the lead frame and the image-sensing die are electrically coupled to the top circuit pattern layer.

19. The method of claim 18, wherein:
the lead frame includes an outer end surface that is attached to the positioning surface and that is exposed from the top surface after the forming of the insulating package;
the image-sensing die has an outer surface that is attached to the positioning surface and that is exposed from the top surface after the forming of the insulating package;
the light-emitting element has an outer surface that is attached to the positioning surface and that is exposed from the top surface after the forming of the insulating package; and
the outer end surface of the lead frame, the outer surface of the image-sensing die, and the outer surface of the light-emitting element are co-planar with the top surface of the insulating package.

20. The method of claim 19, further comprising a step of forming a light-transmissive protecting layer to cover the top surface of the insulating package, the outer surface of the image-sensing die, the outer surface of the light-emitting element, the outer end surface of the lead frame, and the top circuit pattern layer.

21. The method of claim 19, wherein the lead frame further has a connecting surface that is exposed from and co-planar with the bottom surface of the insulating package after the forming of the insulating package.

22. The method of claim 18, wherein:
the light-emitting element is a sapphire-based LED and has an outer surface that is connected to the positioning surface and that is exposed from the top surface of the insulating package after the forming of the insulating package, and first and second electrodes that are disposed on the outer surface of the light-emitting element; and
the first and second electrodes of the light-emitting element are electrically coupled to the top circuit pattern layer.

23. The method of claim 18, wherein the light-emitting element is a thin-GaN LED and has
an outer surface that is connected to the positioning surface of the positioning member and that is exposed from the top surface of the insulating package,
an inner surface that is opposite to the exposed surface, and
first and second electrodes that are disposed on the inner surface,
the method further comprising, prior to the forming of the insulating package, a step of providing a pair of connecting wires, each of which is electrically coupled to the lead frame and a respective one of the first and second electrodes.

24. The method of claim 18, wherein prior to the formation of the top circuit pattern layer, further comprising a step of rotating the insulating package in such a manner that the top surface faces upward.

25. The method of claim 18, wherein the positioning member is a tape, and the positioning surface is an adhesive plane.

26. The method of claim 18, further comprising a step of forming a conductive element on a connecting surface of the lead frame which is opposite to the positioning surface prior to the forming of the insulating package.

27. The method of claim 26, wherein:
the lead frame further includes an outer end surface that is attached to the positioning surface and that is exposed from the top surface after the forming of the insulating package;
the image-sensing die has an outer surface that is attached to the positioning surface and that is exposed from the top surface after the forming of the insulating package;
the light-emitting element has an outer surface that is attached to the positioning surface and that is exposed from the top surface after the forming of the insulating package; and
the outer end surface of the lead frame, the outer surface of the image-sensing die, and the outer surface of the light-emitting element are coplanar with the top surface of the insulating package.

28. The method of claim 27, further comprising a step of forming a light-transmissive protecting layer to cover the top surface of the insulating package, the outer surface of the image-sensing die, the outer surface of the light-emitting element, the outer end surface of the lead frame, and the top circuit pattern layer.

29. The method of claim 26, wherein:
the light-emitting element is a thin-GaN LED and has
an outer surface that is connected to the positioning surface and that is exposed from the top surface after the forming of the insulating package,
an inner surface that is opposite to the outer surface,
a first electrode that is disposed on the outer surface of the light-emitting element, and
a second electrode that is disposed on the inner surface of the light-emitting element;
the first electrode of the light-emitting element and a connecting region of the outer surface of the image-sensing die are electrically coupled to the top circuit pattern layer after the forming of the top pattern layer; and
the method further comprises a step of establishing an electrical connection between the second electrode and the connecting lead prior to the forming of the insulating package.

30. The method of claim 26, wherein:
the light-emitting element is a sapphire-based LED and has
an outer surface that is connected to the positioning surface of the positioning member and that is exposed from the top surface of the insulating package after the forming the of insulating package, and
first and second electrodes that are disposed on the outer surface of the light-emitting element; and
the first and second electrodes of the light-emitting element and a connecting region of the outer surface of the image-sensing die are electrically coupled to the top circuit pattern layer after the forming of the top circuit pattern layer.

31. The method of claim 26, wherein the light-emitting element is a sapphire-based LED and has
an outer surface that is connected to the positioning surface of the positioning member and that is exposed from the top surface after the forming of the insulating package, an inner surface that is opposite to the outer surface, and first and second electrodes that are disposed on the inner surface, the method further comprising, prior to the forming of the insulating package, a step of providing a pair of connecting wires, each of which electrically interconnects the connecting surface of the lead frame and a respective one of the first and second electrodes.

32. The method of claim 26, wherein:
the conductive element has an inner end surface that is exposed from and coplanar with the bottom surface after the forming of the insulating package; and
the method further comprises a step of forming a bottom circuit pattern layer on the bottom surface of the insulating package, such that the inner end surface of the conductive element is electrically coupled to the bottom circuit pattern layer.

33. The method of claim 32, wherein the forming of the insulating package includes grinding the bottom surface of the insulating package to expose the inner end surface of the conductive element.

34. The method of claim 26, further comprising a step of rotating the insulating package in such a manner that the top surface faces upward.

35. The method of claim 26, wherein the positioning member is a tape, and the positioning surface is a planar adhesive surface.

36. A method of producing a fingerprint sensing device, comprising the steps of:
providing a supporting component including a positioning member that has a positioning surface, and a lead frame that is connected to the positioning surface;
attaching an image-sensing die and a light-emitting element onto the positioning surface of the positioning member;
forming an insulating package to encapsulate the image-sensing die, the light-emitting element and the lead frame, wherein the insulating package has a top surface that is connected to the positioning surface of the positioning member, and a bottom surface;
forming a hole in the insulating package so as to expose a connecting surface of the lead frame, the hole being defined by a surrounding surface;
forming a conductive element on the surrounding surface which is electrically coupled to the connecting surface of the lead frame;
removing the positioning member from the insulating package, so as to expose the lead frame, the image-sensing die, and the light-emitting element from the top surface of the insulating package; and
forming a top circuit pattern layer on the top surface of the insulating package, such that the lead frame and the image-sensing die are electrically coupled to the top circuit pattern layer.

* * * * *